United States Patent
David

(10) Patent No.: US 10,430,719 B2
(45) Date of Patent: Oct. 1, 2019

(54) PROCESS CONTROL TECHNIQUES FOR SEMICONDUCTOR MANUFACTURING PROCESSES

(71) Applicant: STREAM MOSAIC, INC., San Jose, CA (US)

(72) Inventor: Jeffrey Drue David, San Jose, CA (US)

(73) Assignee: STREAM MOSAIC, INC., San Jose, CA (US)

(*) Notice: Subject to any disclaimer, the term of this patent is extended or adjusted under 35 U.S.C. 154(b) by 195 days.

(21) Appl. No.: 15/394,540

(22) Filed: Dec. 29, 2016

(65) Prior Publication Data

US 2017/0109646 A1    Apr. 20, 2017

Related U.S. Application Data

(63) Continuation-in-part of application No. 14/952,266, filed on Nov. 25, 2015, now abandoned.

(Continued)

(51) Int. Cl.
*G06N 7/00* (2006.01)
*H01L 21/66* (2006.01)
(Continued)

(52) U.S. Cl.
CPC ............. *G06N 7/005* (2013.01); *G03F 7/705* (2013.01); *G03F 7/70625* (2013.01); *G03F 7/70633* (2013.01); *G06N 20/00* (2019.01); *H01L 22/12* (2013.01); *H01L 22/14* (2013.01); *H01L 22/20* (2013.01)

(58) Field of Classification Search
CPC .. G03F 7/70633; G03F 7/70625; G03F 7/705; G03F 7/70508; G03F 7/70616; G05B 19/41875; G05B 2219/45031; G05B 13/048; G05B 13/027; G05B 13/04; (Continued)

(56) References Cited

U.S. PATENT DOCUMENTS 3,751,647 A    8/1973  Maeder et al.
5,793,650 A    8/1998  Mirza
(Continued)

FOREIGN PATENT DOCUMENTS

CN    101738991 B    9/2014

OTHER PUBLICATIONS

Pilsung Kang et al., 'Virtual Metrology for Run-to-Run Control in Semiconductor Manufacturing', 2011, vol. 38, pp. 2508-2522, Elsevier, Expert Systems with Application.
(Continued)

*Primary Examiner* — Telly D Green
(74) *Attorney, Agent, or Firm* — Dergosits & Noah LLP

(57) ABSTRACT

Techniques for measuring and/or compensating for process variations in a semiconductor manufacturing processes. Machine learning algorithms are used on extensive sets of input data, including upstream data, to organize and pre-process the input data, and to correlate the input data to specific features of interest. The correlations can then be used to make process adjustments. The techniques may be applied to any feature or step of the semiconductor manufacturing process, such as overlay, critical dimension, and yield prediction.

14 Claims, 16 Drawing Sheets

Related U.S. Application Data

(60) Provisional application No. 62/084,551, filed on Nov. 25, 2014, provisional application No. 62/091,567, filed on Dec. 14, 2014, provisional application No. 62/103,946, filed on Jan. 15, 2015, provisional application No. 62/437,055, filed on Dec. 20, 2016.

(51) Int. Cl.
*G06N 20/00* (2019.01)
*G03F 7/20* (2006.01)

(58) Field of Classification Search
CPC ...... H01L 22/20; H01L 2924/00; Y02P 90/22; Y02P 90/14
See application file for complete search history.

(56) References Cited

U.S. PATENT DOCUMENTS

| | | | |
|---|---|---|---|
| 5,923,553 A | 7/1999 | Yi | |
| 6,610,550 B1 | 8/2003 | Pasadyn et al. | |
| 6,751,519 B1* | 6/2004 | Satya | H01L 22/20 |
| | | | 700/109 |
| 6,819,426 B2 | 11/2004 | Sezginer et al. | |
| 6,968,253 B2 | 11/2005 | Mack et al. | |
| 7,117,057 B1 | 10/2006 | Kuo et al. | |
| 7,184,853 B2 | 2/2007 | Roberts et al. | |
| 7,289,214 B1 | 10/2007 | Li et al. | |
| 7,403,832 B2 | 7/2008 | Schulze et al. | |
| 7,842,442 B2 | 11/2010 | Seltmann et al. | |
| 7,873,585 B2 | 1/2011 | Izikson | |
| 7,957,826 B2 | 6/2011 | Ausschinitt et al. | |
| 8,233,494 B2 | 7/2012 | Amini et al. | |
| 8,339,595 B2 | 12/2012 | Den Boef | |
| 9,002,498 B2 | 4/2015 | Chang | |
| 9,087,176 B1 | 7/2015 | Chang et al. | |
| 9,116,442 B2 | 8/2015 | Adel et al. | |
| 2003/0014145 A1 | 1/2003 | Reiss et al. | |
| 2003/0074639 A1 | 4/2003 | Park et al. | |
| 2003/0229410 A1 | 12/2003 | Smith et al. | |
| 2004/0167655 A1 | 8/2004 | Middlebrooks et al. | |
| 2004/0181728 A1 | 9/2004 | Pellegrini | |
| 2004/0233439 A1 | 11/2004 | Mieher | |
| 2008/0057418 A1 | 3/2008 | Seltmann | |
| 2008/0262769 A1 | 10/2008 | Kadosh et al. | |
| 2008/0275586 A1 | 11/2008 | Ko et al. | |
| 2010/0321654 A1 | 12/2010 | Den Boef | |
| 2013/0054186 A1 | 2/2013 | Den Boef | |
| 2013/0060354 A1 | 3/2013 | Choi et al. | |
| 2013/0110276 A1 | 5/2013 | Cheng et al. | |
| 2013/0208279 A1 | 8/2013 | Smith | |
| 2013/0230797 A1 | 9/2013 | Van Der Sanden | |
| 2013/0282340 A1 | 10/2013 | Liu et al. | |
| 2013/0310966 A1 | 11/2013 | MacNaughton et al. | |
| 2014/0094015 A1 | 4/2014 | Kasa | |
| 2014/0094101 A1 | 4/2014 | Kasa | |
| 2014/0362363 A1 | 12/2014 | Cai | |
| 2015/0253373 A1 | 9/2015 | Callegari et al. | |
| 2015/0369857 A1* | 12/2015 | Nakamura | G01R 31/2855 |
| | | | 438/15 |
| 2018/0060733 A1* | 3/2018 | Beller | G06F 16/9024 |

OTHER PUBLICATIONS

William H. Arnold, Towards 3nm Overlay and Critical Dimension Uniformity: An Integrated Error Budget for Double Patterning Lithography, 2008, SPIE vol. 6924, Optical Microlithography XXI, pp. 1-9.

Prasad Dasari, Jie Li, Jiangtao Hu, Nigel Smith and Oleg Kritsun (2011). Diffraction Based Overlay Metrology for Double Patterning Technologies, Recent Advances in Nanofabrication Techniques and Applications, Prof. Bo Cui (Ed.), ISBN: 978-953-307-602-7, InTech, Available from: http://www.intechopen.com/books/recentadvances-in-nanofabrication-techniques-and-applications/diffraction-based-overlay-metrology-for-doublepatterning-technologies.

Peter M. O'Neili et al., 'Statistical Test: A New Paradigm to Improve Test Effectiveness & Efficiency', 2007, pp. 1-10, IEEE International Test Conference. ISBN: 1-4244-1128-9/07.

Ajay Khochel et al., 'A Tutorial on STDF Fail Datalog Standard', 2008, pp. 1-10, IEEE International Test Conference, ISBN: 1-4244-4203-0/08.

Raphael Robertazzi et al., 'New Tools and Methodology for Advanced Parametric and Defect Structure Test', 2010, pp. 1-10, IEEE International Test Conference, ISBN: 978-1-4244-7207-9/10.

Shane A. Lynn, 'Real-Time Virtual Metrology and Control of Etch Rate in an Industrial Plasma Chamber', pp. 1-6; Part of 2012 IEEE Multi-Conference on Systems and Control; Oct. 3-5, 2012. Dubrovnik, Croatia 2012 IEEE International Conference on Control Applications (CCA).

Rao Desineni et al., 'The Grand Pareto: A Methodology for Identifying and Quantifying Yield Detractors in Volume Semiconductor Manufacturing', May 2, 2007, pp. 87-100, vol. 20, IEEE Transactions on Semiconductor Manufacturing.

Pieter Kneilssen et al., Powerpoint Presentation titled 'Litho InSight, a novel approach towards on-product litho performance improvement'; 31 pages, APC Conference XXVI in Ann Arbor, Michigan.

John C. Robinson, Ph.D., 'Intelligent Feed-forward of Non-Litho Errors for 3D Patterning', 20 pages, Sep. 30, 2014, APC Conference XXVI in Ann Arbor, Michigan.

Michael Hackerott, 'Semiconductor Manufacturing and Engineering Data Analysis', 38 pages.

Prasad Dasari et al, 'A Comparison of Advanced Overlay Technologies', 9 pages, 2010, vol. 7638, Metrology, Inspection, and Process Control for Microlithography XXIV, ccc Code: 0277-786X/10, doi: 10.1117/12.848189.

Daewoong An et al., 'A Semiconductor Yields Prediction Using Stepwise Support Vector Machine', Nov. 17-20, 2009, Proceedings of 2009 IEEE International Symposium on Assembly and Manufacturing in Suwon Korea, 7 pages.

Sae-Rom Pak et al., 'Yield Prediction using Support Vectors Based Under-Sampling in Semiconductor Process', pp. 896-900, Dec. 20, 2012, International Scholarly and Scientific Research & Innovation vol. 6, World Academy of Science, Engineering and Technology.

International Search Report and Written Opinion for PCT Application No. PCT/US2015//062693; dated Feb. 9, 2016.

Office Action for U.S. Appl. No. 14/952,266 dated Jun. 30, 2016.

* cited by examiner

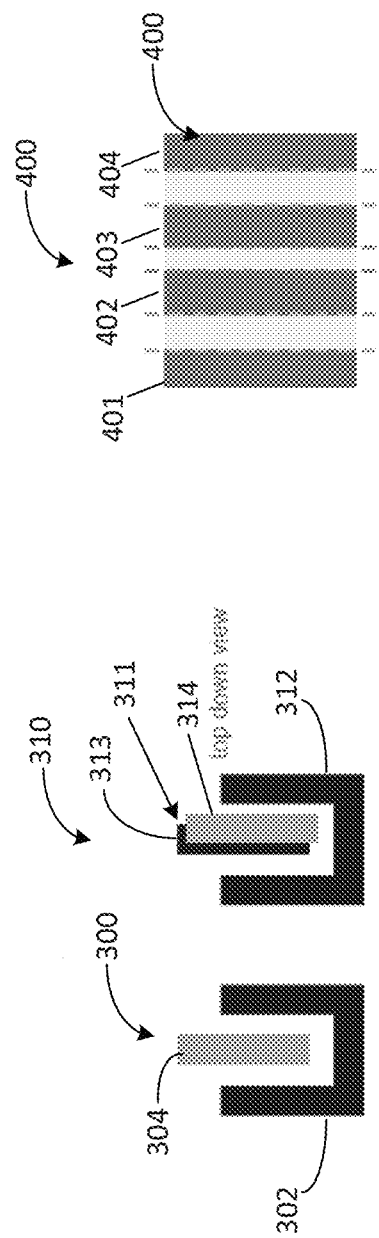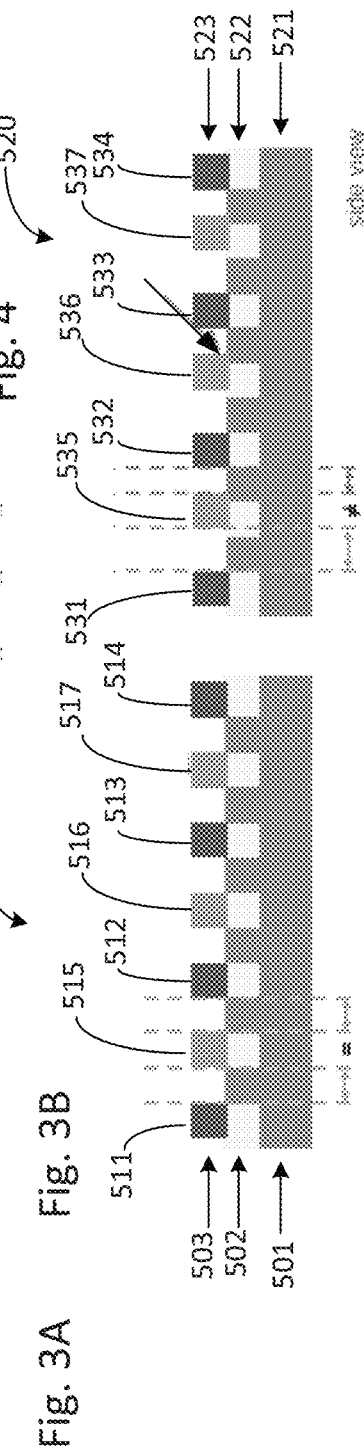

*Step 1:*
*yield_prediction = weight_1 \* (yield_prediction_classification) + weight_2 \* (confidence_metric + offset1) + weight_3 \* (final_test_result_1+offset2) + weight_4 \* (final_test_result_2+offset3)*

*Step 2:*
*If yield_prediction >= defined_threshold, then product is good and usable*

*Step 3:*
*If yield_prediction < defined_threshold, then product is failed and not usable*

*Where:*

*a) yield_prediction is the yield prediction made by yield prediction system.*

*b) yield_prediction_classification is the output of the classification algorithm used in the yield prediction system.*

*c) confidence_metric is a real number between 0 and 1, 1 being highest confidence and 0 being lowest confidence. The confidence metric can be a number normalized to be between 0 and 1 from a previous confidence metric or propensity metric.*

*d) defined_threshold time is a predetermined threshold applied to a real number that can be bounded. The threshold is used to separate good yield predictions from bad yield predictions.*

*e) weight1 is a predetermined weight of the confidence metric calculation.*

*f) offset1 is a predetermined offset of the confidence metric calculation.*

Fig. 13

*If yield_prediction = good, then burn_in_time = user_defined_max_burn_in_time * weight1*(1-confidence_metric + offset1),*

*If yield_prediction = bad, then burn_in_time = user_defined_max_burn_in_time.*

*where*
- *a) yield_prediction is the yield prediction made by yield prediction system or the algorithm. The algorithm can be a classification algorithm.*
- *b) confidence_metric is a real number between 0 and 1, 1 being highest confidence and 0 being lowest confidence. The confidence metric can be a number normalized to be between 0 and 1 from a previous confidence metric or propensity metric.*
- *c) user_defined_max_burn_in_time is a predetermined burn-in time that can be the standard burn-in time already used, or a burn-in time deemed likely to identify a part as reliable or not reliable.*
- *d) weight1 is a predetermined weight of the confidence metric calculation.*
- *e) offset1 is a predetermined offset of the confidence metric calculation.*

Fig. 14

PROCESS CONTROL TECHNIQUES FOR SEMICONDUCTOR MANUFACTURING PROCESSES

CROSS REFERENCE

This application claims priority from U.S. Patent Application No. 62/437,055 entitled A System for Machine Learning Assistance of Manufacturing Processes, filed Dec. 20, 2016, and also from U.S. patent application Ser. No. 14/952,266 entitled Process Control Techniques for Semiconductor Manufacturing Processes, filed Nov. 25, 2015, which in turn claimed priority from U.S. Patent Application No. 62/084,551 entitled System and Methods for Overlay Error Compensation, Measurements, and Lithography Apparatus Control, filed Nov. 25, 2014; U.S. Patent application No. 62/091,567 entitled System and Methods for Yield Prediction, Test Optimization, and Burn-In Optimization, filed Dec. 14, 2014; and U.S. Application Patent No. 62/103,946 entitled System and Methods for Using Algorithms for Semiconductor Manufacturing, filed Jan. 15, 2015. Each of the foregoing applications is incorporated herein by reference in its entirety.

TECHNICAL FIELD

This disclosure relates generally to semiconductor manufacturing processes, and more particularly, to improved process control techniques for lithography, yield prediction, and other aspects of semiconductor manufacturing processes.

BACKGROUND

The semiconductor manufacturing industry is known as a complex and demanding business, and it continues to evolve with major changes in device architectures and process technologies. Traditionally, the semiconductor industry has been characterized by sophisticated high-tech equipment, a high degree of factory automation, and ultra-clean manufacturing facilities that cost billions of dollars in capital investment and maintenance expense.

For decades, semiconductor manufacturing was driven by Moore's Law and planar transistor architecture. This provided a predictable, self-sustaining roadmap for transistor cost scaling and well-defined interfaces where each individual process/layer could follow its own technology trajectory independently. However, as the industry scales to provide sub-20 nm nodes and other popular device architectures, such as MEMS, new processes are required, and new approaches for semiconductor manufacturing are being explored and implemented.

For sub-20 nm nodes, entirely new device architectures are needed. In parallel, the rapid growth in the Internet of Things (IoT) is driving the MEMS market. These changes have presented difficult and unprecedented challenges for the industry, generally resulting in lower manufacturing yields.

In order to achieve acceptable yield and device performance levels with these new architectures, very tight process specifications must be achieved. Thus, better process control and integration schemes are needed now more than ever.

One example of a specific current challenge for the industry is lithography processes for sub-20 nm node manufacturing. EUV lithography techniques are known but have not yet been widely adopted for production, and therefore, 193 nm immersion lithography must extend its capability via multi-patterning schemes, which adds masks and process steps, and is therefore complicated and expensive.

Various processes also require more complex integration, and therefore can no longer be developed independently of each other. For example, the three-dimensional architecture of finFET's and 3-D NAND's, as well as the complex relationships between corresponding process steps, have changed the way that process variabilities can affect device performance and yield. As an example, many semiconductor manufacturers are experiencing lower yield on their finFET lines, and the need to increase yield is urgent. In the memory space, 3-D NAND has become the dominant architecture, and process control is a key issue for 3-D NAND process layers. The IoT space is increasingly dominated by the "More-than-Moore" trend, where devices incorporate technologies that do not necessarily scale to Moore's Law. This growing market space is driven by diversified and specific processes, and the need for new ways to improve yield and reduce manufacturing costs when implementing manufacturing solutions is needed.

BRIEF DESCRIPTION OF THE DRAWINGS

FIG. 3A is a top plan view of features formed in two different layers of a device, with no overlay error.

FIG. 3B is a top plan view of features formed in two different layers of a device, with overlay error.

FIG. 4 is a top plan view of features formed in a single layer of a device, with a critical dimension error.

FIG. 5A is a side plan view of a substrate having features formed in two different layers of a device, with no critical dimension or overlay errors.

FIG. 5B is a side plan view of a substrate having features formed in two different layers of a device, with no critical dimension or overlay errors.

FIG. 13 shows equations illustrating a process for determining the status of a manufactured product as a function of weighted test data, confidence metrics, and classification.

FIG. 14 shows equations illustrating a process for optimizing burn-in time.

DETAILED DESCRIPTION

1. Overview

This disclosure describes new techniques for measuring and/or compensating for process variations in production runs of a semiconductor manufacturing processes, for using these techniques to predict yield at any step of the process, and for optimizing testing and burn-in procedures. For example, machine learning algorithms can be used to create new approaches to data analysis by incorporating new types of input data, and the data can be more effectively correlated, organized and pre-processed, then used to make process adjustments. Data from prior production runs can be used to create a model for a target parameter, and data from a current production run can be input to the model to generate a prediction for the target parameter, and to correlate the prediction with the actual data.

2. Semiconductor Manufacturing Processes Generally

Figure 1:
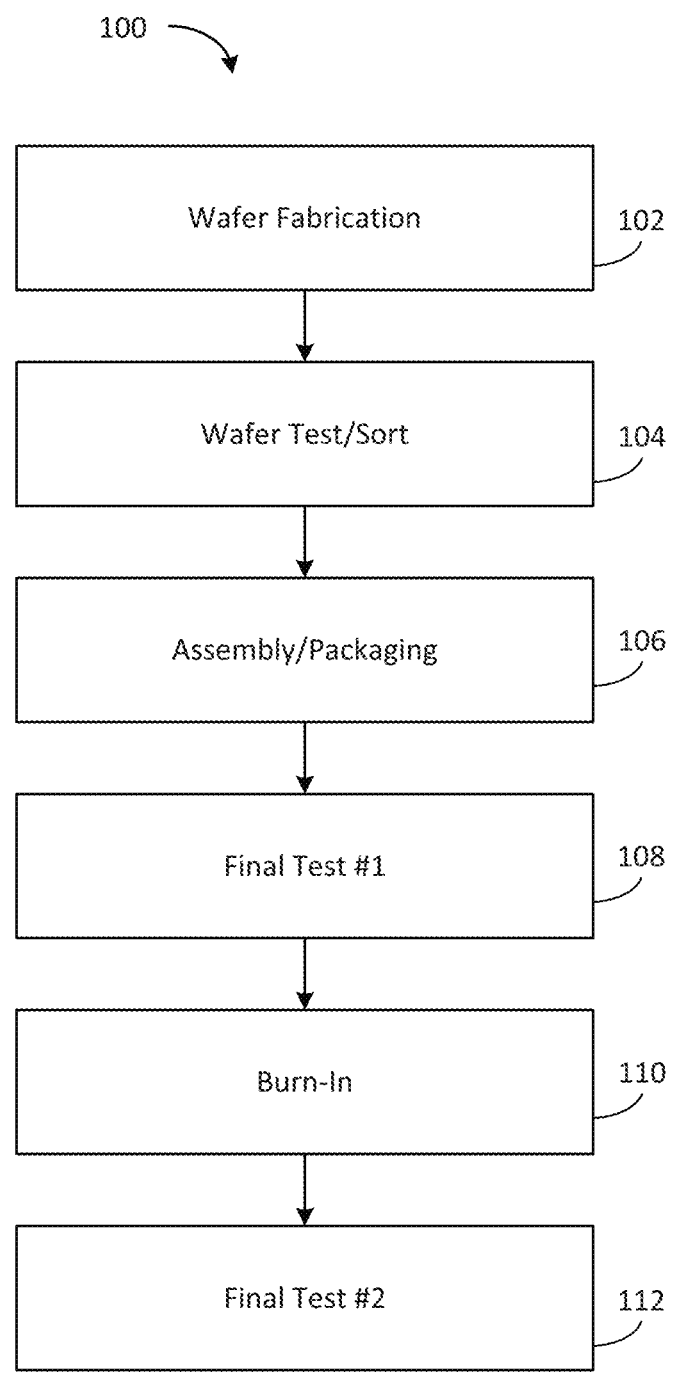
FIG. 1 is a flow chart illustrating a process for making a semiconductor device.

FIG. 1 is a high level view a typical semiconductor manufacturing process 100, in which there may actually be hundreds of steps. In general, data can be collected at every step and sub-step of the process for a production run, and yield may be calculated for each step as well as total yield for the entire process predicted.

Wafer fabrication occurs in step 102, where a large number of integrated circuits are formed on a single slice of semiconductor substrate, such as silicon, known as a wafer. Many steps are required in various sequences to build different integrated circuits. For example, deposition is the process of growing an insulating layer on the wafer. Diffusion is the process of baking impurities into areas of the wafer to alter the electrical characteristics. Ion implantation is another process for infusing the silicon with dopants to alter the electrical characteristics. In between these steps, lithographic processing allows areas of wafer to be patterned with an image, then a mask is used to expose photoresist that has been applied across the wafer, and the exposed photoresist is developed. The pattern is then etched to remove selected portions of the developed photoresist, and these steps are repeated to create multiple layers. Finally, metallization is a specialized deposition process that forms electrical interconnections between various devices/circuits formed on the wafer. The fabrication process can take several months to complete before moving on to the post-fabrication steps.

Wafer test and sort occurs in step 104. After a wafer has been fabricated, all the individual integrated circuits that have been formed on the wafer are tested for functional defects, for example, by applying test patterns using a wafer probe. Circuits may either pass or fail the testing procedure, and failed circuits will be marked or otherwise identified, e.g., stored in a file that represents a wafer map.

Assembly and packaging takes place in step 106. The wafer is diced up into separate individual circuits or dies, and each die that passes through wafer sort and test is bonded to and electrically connected to a frame to form a package. Each die/package is then encapsulated to protect the circuit.

In step 108, the packages are subjected to random electrical testing to ensure that circuits in the package are still working as expected.

In step 110, the remaining packages go through a burn-in cycle by exposing the package to extreme but possible operating conditions. Burn-in may involve electrical testing, thermal exposure, stress screening, or a combination of these, over a period of time. Burn-in testing reveals defective components.

Finally, in step 112, a final round of electrical testing is conducted on the remaining packages.

3. Machine Learning Algorithms

Recent advances in computing technologies and data analysis techniques, such as performing parallel processing on a massive scale, has led to progress in machine learning algorithms, data mining, and predictive analytics. Machine Learning is a branch of artificial intelligence that involves the construction and study of systems that can learn from data. These types of algorithms, along with parallel processing capabilities, allow for much larger datasets to be processed, without the need to physically model the data. This opens up the possibility of incorporating data analysis to make corrections on the lithographic apparatus for overlay error and critical dimension (CD) variation. For example, in addition to using the usual parameters to correct for overlay error (e.g., CD metrology, on-scanner data, wafer shape and geometry metrology, DBO measurement), process parameters and other metrology from upstream processes and metrology can also be used to train a machine learning algorithm.

Data has always played a role in semiconductor and electronics manufacturing. In the semiconductor industry, data was initially collected manually to track work-in-progress (WIP). The types of data collected included metrology data (measurements taken throughout the IC fabrication process), parametric test data, die test data, final test data, defect data, process data, and equipment data. Standard statistical and process control techniques were used to analyze and utilize the datasets to improve yields and manufacturing efficiencies. In many instances, the analysis was performed in a manual "ad-hoc" fashion by domain experts.

However, as device nodes became smaller and tolerances became tighter, factories became more automated and the ability to collect data improved. Even with this improvement in the ability to collect data, it has been estimated that no more than half of the data is ever processed. Further, of the data that is processed and stored, more than 90% of it is never again accessed.

Moving forward, data volume and velocity continues to increase rapidly. The recent norm for data collection rates on semiconductor process tools is 1 Hz. The International Technology Roadmap for Semiconductors (ITRS) predicts that the requirement for data collection rates will reach 100 Hz in three years. Most experts believe a more realistic rate will be 10 Hz. Even a 10 Hz rate represents a 10× increase in data rates. In addition to faster data rates, there are also more sensors being deployed in the semiconductor manufacturing process. For example, Applied Materials Factory Automation group has a roadmap that shows that advanced technology requirements are driving a 40% increase in sensors.

Given the massive amount of sensor data now collected, and the low retention rates of the data, advancements in data science could and should be implemented to solve the problems of the semiconductor industry. Some progress has been made to leverage data to improve efficiencies in the semiconductor and electronics industries. For example, microchip fabrication factories are combining and analyzing data to predict when a tool for a particular process needs maintenance, or to optimize throughput in the fab.

Figure 2:
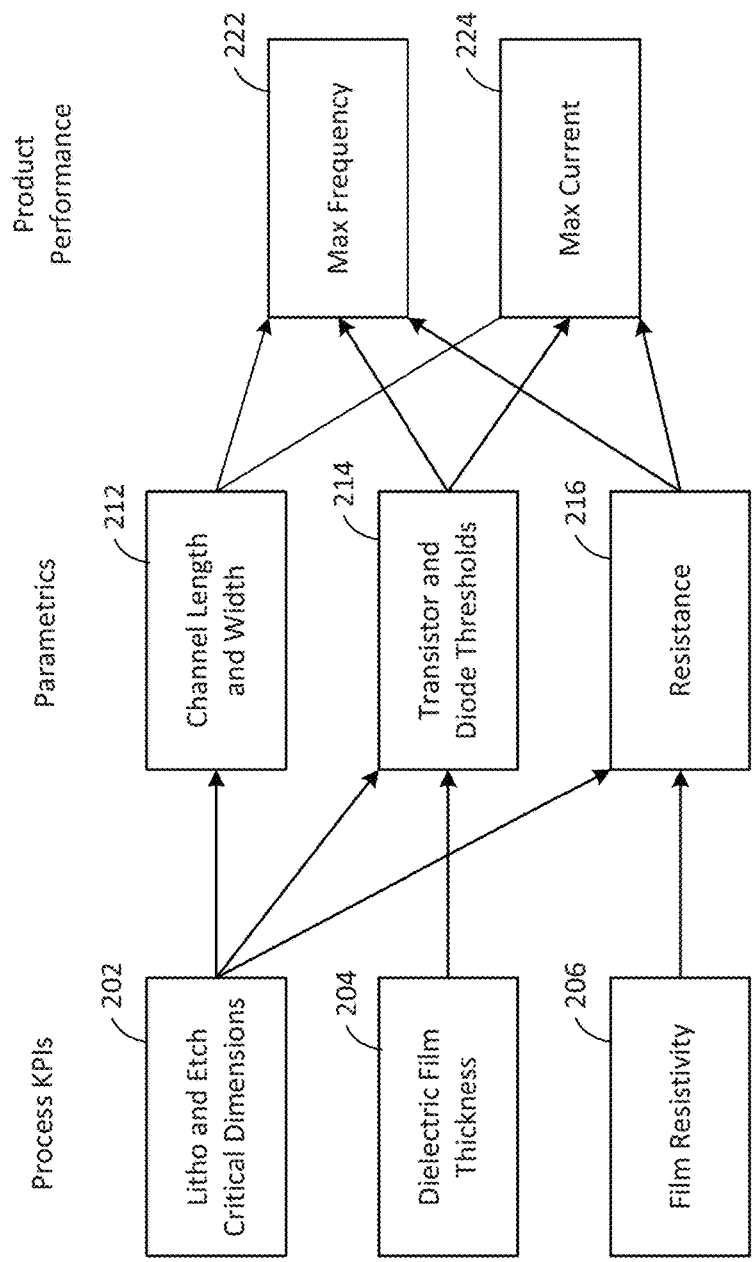
FIG. 2 is a block diagram illustrating relationships between different steps of the process of FIG. 1 and their cumulative effects on process variation and product performance.

Predictive analytics and Machine Learning Algorithms can thus be used to address the challenges facing the semiconductor industry. By drilling deeper into the details of semiconductor manufacturing and knowing how to apply predictive analytics to detect and resolve yield issues faster, and to tighten and target the specifications of individual manufacturing steps, increased yield can result. FIG. 2 shows an example of the cumulative effects of process variation on product performance. The relationships can be complex and difficult to correlate, e.g., key performance indicators (KPIs) of the process steps, such as the critical dimensions of lithographic and etch steps 202, the dielectric film thickness 204, and film resistivity 206; parametrics, such as channel length and width 212, transistor and diode thresholds 214, and resistance 216; and product performance, such as maximum frequency 222, and maximum current 224. We can use predictive analytics to quantify those relationships, and then leverage the relationships to predict and improve product performance.

The semiconductor industry presents some unique challenges for applying predictive analytics and machine learning algorithms. Some of these challenges are: nonlinearity in most batch processes; multimodal batch trajectories due to product mix; process drift and shift; small amount of training data (maybe less than a lot); and process steps with variable durations (often deliberately adjusted).

A good understanding of these challenges is needed to properly employ predictive analytics. If applied properly, predictive analytics can find complex correlations that may have been difficult to uncover using other techniques. This new access to deeper understanding and insight can then be leveraged to increase yield, improve device performance, and reduce costs like never before.

In one example, machine learning algorithms can be used to predict yield. Yield prediction for a product refers to the prediction of the quality or usability of the product after any number of manufacturing steps are completed. If the yield prediction for a product is "good" at a given manufacturing step, then that product is predicted to be usable as of that manufacturing process and should continue processing. If the yield prediction is predicted to be "bad", then that product is predicted to be faulty or not usable as of that manufacturing step and is not recommended for continued processing. The yield prediction is useful in determining if it is cost effective to continue processing of a product. In some embodiments, the yield prediction is a component in deciding whether or not to continue processing of the product. The yield prediction is not necessarily the only variable in making a decision about whether or not to continue processing of a product.

In another example, virtual metrology can use machine learning algorithms to predict metrology metrics such as film thickness and critical dimensions (CD) without having to take actual measurements, in real-time. This can have a big impact on throughput and also lessen the need for expensive TEM or SEM x-section measurements. Based on sensor data from production equipment and actual metrology values of sampled wafers to train the algorithm, virtual metrology can predict metrology values for all wafers. The algorithm can be a supervised learning algorithm, where a model can be trained using a set of input data and measured targets. The targets can be the critical dimensions that are to be controlled. The input data can be upstream metrology measurements, or data from process equipment (such as temperatures and run times).

In yet another example, the metrology measurements taken in-situ, or after a particular semiconductor process is complete, can be used as part of the input data for the virtual metrology system. For example, metrology data can be collected after a CMP step that occurred in one or more processing steps preceding the current lithography step. These metrology measurements can also be thickness data determined by each metrology system, or the refractive index and absorption coefficient.

In another example, metrology data can be collected during etch processes. Optical emissions spectra or spectral data from photoluminescence can be utilized as input data. Data transformation or feature engineering can be performed on in-situ spectral data or other sensor data that is collected during a particular process such as etch, deposition, or CMP. As an example, multiple spectra may be collected in-situ during processing. The spectral set used may be all spectra collected during processing, or a subset of spectra collected during processing. Statistics such as mean, standard deviation, min, and max may be collected at each wavelength interval of the spectral set over time and used as data inputs. As an alternative example, similar statistics can be collected for a given spectrum, and the time series of those statistics can be used as data inputs. As yet another example, peaks and valleys in the spectrum can be identified and used as data inputs (applying similar statistical transformation). The spectra may need to be normalized or filtered (e.g., lowpass filter) to reduce process or system noise. Examples of in-situ spectral data include reflectometry from the wafer, optical emissions spectra (OES), or photoluminescence.

In yet another example, the target of a virtual metrology model can be the output of wafer probe tests, or measurements made by wafer probe tests. Additionally, the outputs from final wafer electrical testing, wafer sort tests and wafer acceptance tests can be used as a target to the virtual metrology model. Examples of final wafer electrical testing parameters include, but are not limited to, diode characteristics, drive current characteristics, gate oxide parameters, leakage current parameters, metal layer characteristics, resistor characteristics, via characteristics, etc. Examples of wafer sort parameters include, but are not limited to, clock search characteristics, diode characteristics, scan logic voltage, static IDD, IDDQ, VDD min, power supply open short characteristics, ring oscillator frequency, etc. The target of a virtual metrology model can be the output from a final test. The target can come from tests that occur multiple times under different electrical and temperature conditions, and before and after device reliability stresses, such as burn-in, or tests that occur at a burn-in step. The target can come from electrical tests that are a mix of functional, structural and system-level tests.

In yet another example, machine learning algorithms can be used to control a manufacturing process step. As noted above, virtual metrology can be used to predict a critical dimension or film thickness for a manufacturing process step. Before or during processing of this manufacturing step, the prediction can then be used to set and/or control any number of processing parameters (e.g. run time) for that processing step. For example, in the case of CMP, if virtual metrology predicts that a dielectric film thickness will be 100 Angstroms thicker than the target thickness if the wafer was to be polished at the nominal polish time, then a calculation can be made to lengthen the polish time so that the final polished thickness can be closer to the target thickness.

In yet another example, machine learning algorithms can be used to predict when a fault or defect will occur in the manufacturing process or on a specific tool at a process step. Identifying a machine fault or failure, and finding the root cause of faults quickly can be essential in semiconductor manufacturing. If faults in the manufacturing process can be better detected and resolved, downtime and scrap can be reduced. This is also referred to as fault detection and classification (FDC). If faults can be predicted before they occur, then downtime can be optimally scheduled and scrap can be even further reduced. As an example, decision trees can be used to determine which input features can best predict a fault in a process, and develop decision rules around detecting a fault.

4. Lithography and Overlay Errors

As noted above, lithography processes present a challenge for sub-20 nm node manufacturing. A lithographic apparatus is a machine that applies a desired pattern onto a substrate, usually onto a targeted portion of the substrate. A circuit pattern of an individual integrated circuit (IC) layer is generated by a patterning device, usually referred to as a mask or a reticle, which transfers the pattern onto a target. Typically, the pattern is transferred by imaging onto a layer of material (e.g., resist) that is sensitive to radiation, which has been formed on the substrate. A network of successively patterned adjacent target portions will reside on one substrate.

One type of lithographic apparatus is a stepper, in which the entire pattern of a target portion is exposed in a single instance. Another type of lithography apparatus is a scanner, where the target portion is irradiated via scanning the pattern with a radiation beam in a given direction, while scanning the substrate parallel or anti-parallel to this direction.

The location of patterned features in subsequent layers must be very precise in order to build the devices properly. All features should have sizes and shapes that are formed within specified tolerances. The overlay error, which refers to the offset or mismatch between features on adjacent layers, should be minimized and within tolerance in order for the manufactured devices to function properly. Overlay measurements are thus important for determining the overlay error of a given pattern exposed with a mask on the resist layer.

An overlay measurement module typically performs the overlay measurement using an optical inspection system. The position of the mask pattern in the resist layer relative to the position of the pattern on the substrate is determined by measuring an optical response from an optical marker on the substrate which is illuminated by an optical source. The signal generated by the optical marker is measured by a sensor arrangement. Using the output of the sensors, the overlay error can be derived. Typically, the patterns on which overlay error are measured are located within a scribe lane in between target portions.

Two common concepts for measuring overlay are image based overlay (IBO) and diffraction based overlay (DBO). For IBO, the image position of the substrate pattern is compared to the mask pattern position in the resist layer. Overlay error is a result of the comparison of these two image positions. Imaging approaches are conceptually straightforward, since they are based on analysis of a "picture" directly showing the alignment of the two layers. For example, box-in-box or line-in-line alignment marks are commonly used in the two layers. However, IBO error measurement may be sensitive to vibrations and also to the quality of focus during measurement, which can both result in blurring of the picture. Aberrations in the optics may further reduce the accuracy of the IBO measurement.

For DBO, a first diffraction grating pattern is located on the pattern layer, and a second diffraction grating pattern with identical pitch is located in the resist layer. The second grating should be nominally on top of the first grating, and by measuring the intensity of the diffraction patterns, an overlay measurement may be obtained. If there is an overlay error between the two gratings, it will be detectable in the diffraction pattern. DBO is less sensitive to vibration than IBO.

To make multi-patterning solutions work, especially in light of the extremely small dimensions now being implemented, the need for more precise and accurate mask overlay has become critically important. In addition to minimizing mask overlay errors, critical dimension uniformity (CDU) has also become important as the convolution of overlay error and critical dimension (CD) variation can lead to shorts, connection failures, and malfunctioning devices.

For example, FIG. 3A shows a top view of a portion of a device 300 having a feature 302 formed on a first layer and a feature 304 formed on a second layer, e.g. above the first layer, without any apparent overlay error. Another feature (not shown) is also formed on the first layer under and in direct alignment with feature 304 thereby creating no overlay error.

In contrast, FIG. 3B shows a top view of a portion of a different device 310 having features 312 and 313 formed on the first layer. Feature 314 is formed on the second layer and should line up with feature 313 on the first layer, but in this example exhibits an overlay error 311 due to the misalignment of features 313 and 314.

FIG. 4 shows a top view of a portion of a device 400 having a CD variation between features formed in a single layer. Thus, the dimension between features is designed to be "x" and that dimension is observed between features 401 and 402 and between features 403 and 404. However, between features 402 and 403 the dimension is "less than x" which is a critical dimension error.

FIG. 5A is a side view of a device 500 having a substrate 501 and a first layer 502 of features formed on top of the substrate. A second layer of features 503 is formed on top of the first layer 502 in two different lithography steps. For example, features 511-514 are formed in a first lithography step, and then features 515-517 are formed in a second lithography step. In this example, there are no apparent overlay errors between features on the different layers, as well as no CD errors since the dimension between the features formed in the different lithography steps is consistently "x."

FIG. 5B is a side view of a different device 520 having a substrate 521, a first layer 522 of features formed on top of the substrate, and a second layer of features 503 formed on top of the first layer 502 in two different lithography steps, namely features 531-534 formed in a first lithography step, and features 535-537 formed in a second lithography step. In this example, however, there is an apparent overlay error 550 in the second lithography step as features 535-537 are misaligned relative to the first layer. There is also a CD error between the features formed in the different lithography steps, where the dimension on one side of the features is "greater than x" and the dimension on the other side of the features is "less than x."

Thus, determining and applying compensation for overlay errors and CD errors has become extremely important in the lithography process. Table I below illustrates the ever-tightening budget for acceptable overlay error and CD error for smaller and smaller nodes:

TABLE I

| Technology Node (nm) | 28 | 20 | 14 | 10 |
|---|---|---|---|---|
| Overlay budget (nm) | 9.0 | 6.0 | 4.5 | 3.5 |
| CD spec (nm) | 4.5 | 3.0 | 2.0 | 1.3 |

There are many sources of patterning errors that lead to overlay and CD errors. For example, the reticle may cause placement errors, CD uniformity errors, and haze defects. The lithography and etch processes may have focus and/or exposure errors, overlay issues, etch profile issues (such as CD and shape), and other defects. The wafer fabrication and other processes may have issues with wafer shape and uniformity, film property uniformity, CMP uniformity, thermal processing, and backside and edge defects.

As processing technology transitions toward smaller and smaller nodes, such as 10 nm and 7 nm, there is serious concern about the capability of available metrology solutions. The uncertainty in these solutions must be minimized so the proper adjustments can be made to the scanner or stepper to correct for the overlay and CD errors. While overlay can be defined in an x-y coordinate system, or a vector representing the overlay, there are many components on the lithography apparatus that can provide adjustments to correct for overlay.

Thus, new techniques are described for measuring and/or compensating for lithographic pattern errors such as overlay error and CD error. Machine learning algorithms can be used to create new approaches to data processing and process control. For example, more and varied types of input data can be provided to the machine learning algorithms, and the data can be more effectively organized and pre-processed to determine how to adjust one or more parameters of the lithography apparatus to correct the errors.

Figure 6:
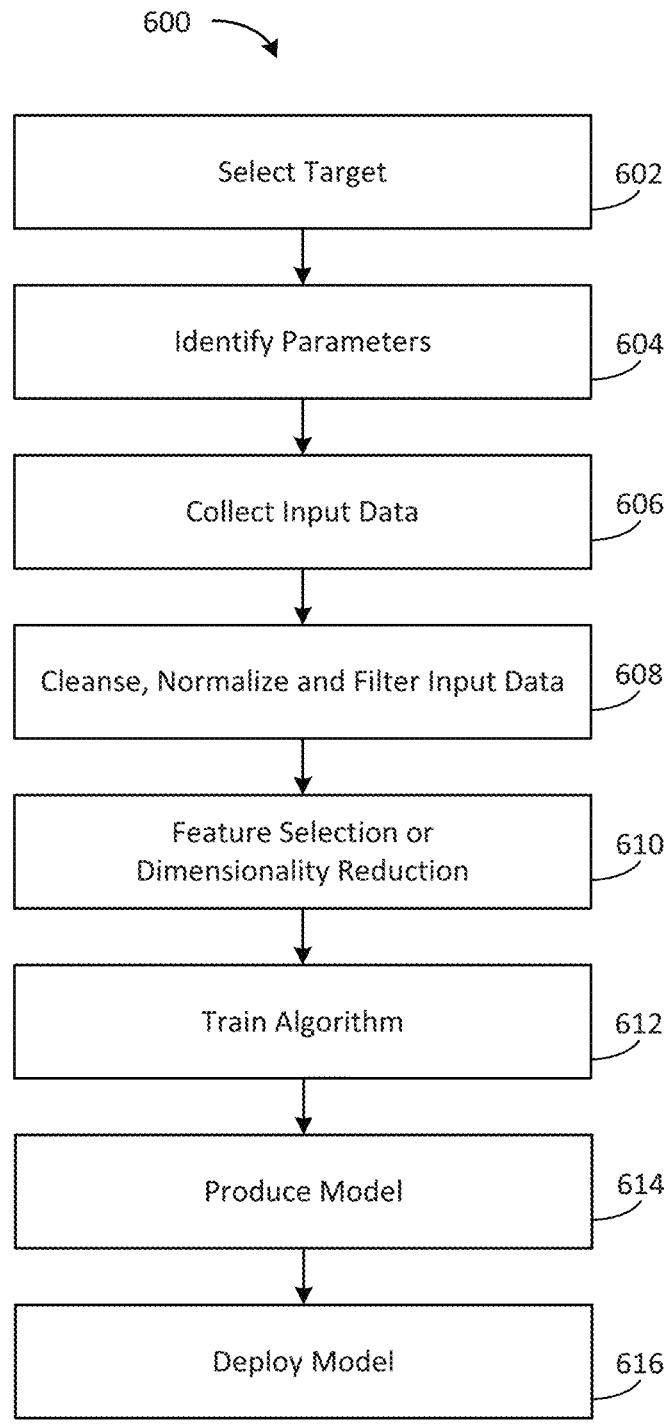
FIG. 6 is a flow chart illustrating a method for training and deploying a model.

Referring to FIG. 6, a flow chart illustrates a method 600 for creating and deploying a model to evaluate a semiconductor manufacturing process in order to correct for errors in a lithographic process, such as overlay errors and CD errors. In step 602, a target is selected. In one embodiment, the target is an overlay measurement (e.g., IBO measurement, DBO measurement, CD-SEM, TEM, etc.) and could be a linear overlay offset in the x and y direction. The target could also be other lithography apparatus parameters that need to be controlled to minimize overlay error, such as reticle position, reticle rotation, or reticle magnification. The target could be parametric data such as on/off current of the transistor, transistor thresholds, or some other parameter that quantifies the health of the transistor. The target could also be yield information, such as the functionality of a given die or area on the wafer (sometimes measured as either pass or fail). The target could also be semiconductor device performance data.

In step 604, the parameters that are useful in evaluating the target are identified, and in step 606, input data relevant to the parameters is collected. Every set of input data is associated with a specific output or target. For example, a set of measured and observed values can be associated with an overlay offset. Those values would be an input vector to the model, and would be associated with the target, e.g., the measured offset. If there are n input variables, then the input vector size for each target would be 1×n. Therefore, if there are m targets, there will be an input data matrix of size m×n, with each row of the input data matrix associated with a target. This is a typical training set in matrix format for a machine learning algorithm. An illustration of this matrix is given in Table II below:

TABLE II

| Target | Input Data | | | |
|---|---|---|---|---|
| Target 1 | Input feature 1, 1 | Input feature 1, 2 | . . . | Input feature 1, n |
| Target 2 | Input feature 2, 1 | Input feature 2, 2 | | Input feature 2, n |
| . . . | | | | |
| Target m | Input feature m, 1 | Input feature m, 2 | | Input feature m, n |

The target data could be collected after other processes have been completed, or could be collected after the semiconductor device has finished all of its processing. Post packaging data could also be used as targets.

Some of the parameters that are already regularly used in overlay error compensation and lithography apparatus control will be used as part of this input dataset. For example, these regularly used parameters can include DBO measurements from the metrology equipment, wafer shape and geometry measurements, or parameters from the lithography apparatus.

Most importantly, other parameters from upstream semiconductor processes and metrology can be used as inputs to the algorithm as well. These input parameters can include other metrology measurements from earlier process steps, including optical reflectometry or ellipsometry (normal incident, polarized or unpolarized light, oblique angles of incidence, and varying azimuth angles).

These metrology measurements can be inputs to the algorithm as an intensity at a given wavelength. For example, metrology data may be incorporated from a reflectometry measurement taken after a certain processing step (for example, etch, or deposition). If the reflectometry data is collected by illuminating the target with unpolarized broadband light and has a detectable wavelength range of 250 nm to 850 nm, then the user could choose to sample that light from 250 nm to 850 nm at 2 nm intervals, to get a total of 301 spectral intensity measurements for that wavelength range. These 301 samples would each be an input to the algorithm. An example of how the input data is associated with a target is shown in Table III.

TABLE III

| Target | Input Data | | | |
|---|---|---|---|---|
| | Intensity 250 nm | Intensity 252 nm | . . . | Intensity 850 nm |
| Target 1 | 1.2 | 1.4 | . . . | 1.5 |
| Target 1 | 1.3 | 1.2 | . . . | 1.7 |
| . . . | . . . | . . . | . . . | . . . |
| Target m | 0.9 | 0.8 | . . . | 1.1 |

The metrology measurements can be taken in-situ, or after a particular semiconductor process is complete. For example, metrology data can be collected after a CMP step that occurred in one or more processing steps preceding the current lithography step. These metrology measurements can also be thickness data determined by each metrology system, or the refractive index and absorption coefficient. In another example, metrology data can be collected during etch processes. Optical emissions spectra or spectral data from photoluminescence can be utilized as input data.

Data transformation or feature engineering can be performed on in-situ spectral data or other sensor data that is collected during a particular process such as etch, deposition, or CMP. As an example, multiple spectra may be collected in-situ during processing. The spectral set used may be all spectra collected during processing, or a subset of spectra collected during processing. Statistics such as mean, standard deviation, min, and max may be collected at each wavelength interval of the spectral set over time and used as data inputs. As an alternative example, similar statistics can be collected for a given spectrum, and the time series of those statistics can be used as data inputs. As yet another example, peaks and valleys in the spectrum can be identified and used as data inputs (applying similar statistical transformation). The spectra may need to be normalized or filtered (e.g., lowpass filter) to reduce process or system noise. Examples of in-situ spectral data include reflectometry from the wafer, optical emissions spectra (OES), or photoluminescence.

The input parameters could also include non-optical measurements, such as Rs (conductivity, resistivity) measurements taken by probes and other types of contact measurements, or contact measurements such as the high resolution profiler (HRP).

The input parameters can also originate from a Plasma Impedance Monitor (PIM) which can be installed between the matching network and the plasma electrodes of an etcher, and can provide data on reactance, impedance, resistance, current, voltage, power, phase and fundamental frequencies.

Process equipment measurements or metrics can also be used as inputs to the algorithm, such as gas flow sensors, power sensors, pressure sensors, temperature sensors, current sensors, voltage sensors, etc. This data can be collected in process steps that occurred before the lithography step where overlay is to be measured and controlled. Examples of these include process time, RF frequency and power from an etch chamber, electric current and impedance measurements, CMP polish times, motor current from the CMP tool, CVD deposition times and information from mass flow controllers, temperatures, pressures, etc. This data could be from any or all upstream processes from the lithography step being performed.

Parametric data and measurements such as channel width and depth, transistor thresholds, and resistance can also be used as inputs to the algorithm.

The diffraction spectra or data used in the DBO technique can be part of the input data as well. All of the above mentioned inputs could be correlated to slight variations in the DBO output, and could thus result in better control of the overlay error compensation or better lithography control given the CD measurements from etch.

CD measurements taken after etch is an important parameter to single out as an input. As discussed above, these measurements are convolved with the overlay error to determine device performance or yield.

In DBO measurement systems, diffracted light is used to measure overlay. However, changes in upstream processes can affect the spectral signature. For example, if there is a shift in the index of refraction of an upstream film property, then the spectral signature can change. Likewise, if the sidewall angle of the diffraction grating shifts due to a process shift, this may cause a change in the spectral signature. Therefore, by training the machine learning algorithm with upstream data that may have an effect on the diffraction spectra, the overlay error can be tightened or the overlay measurement can be made to be more accurate if correlations are discovered between upstream processes and the spectral signature of the diffraction grating.

Returning to FIG. 6, in step 608, filtering, normalization and/or cleansing steps can be performed on the input data.

In step 610, a dimensionality reduction or feature selection step is performed. The purpose of this step is to reduce the number of input parameters for the algorithm. Dimensionality reduction techniques are generally known, for example, principle component analysis (PCA).

In step 612, the data is then fed into the algorithm for training. The algorithm could be one of many different types of algorithms. Examples of machine learning algorithms include Decision Trees, such as CART (Classification and Regression Trees), C5.0, C4.5, and CHAID; Support Vector Regression; Artificial Neural Networks, including Perceptron, Back Propagation, and Deep Learning (BigData enabled); and Ensemble, including Boosting/Bagging, Random Forests, and GBM (Gradient Boosting Machine). The best algorithm may not be a single algorithm, but can be an ensemble of algorithms.

In particular, the GBM (Gradient Boosting Machine) and Random Forests algorithms can produce the best results. Other machine learning algorithms, including the ones mentioned above, can also work well and should be considered.

Given the training input data and training targets, the algorithm will produce a model in step 614. The model can then be deployed in step 616.

Figure 7:
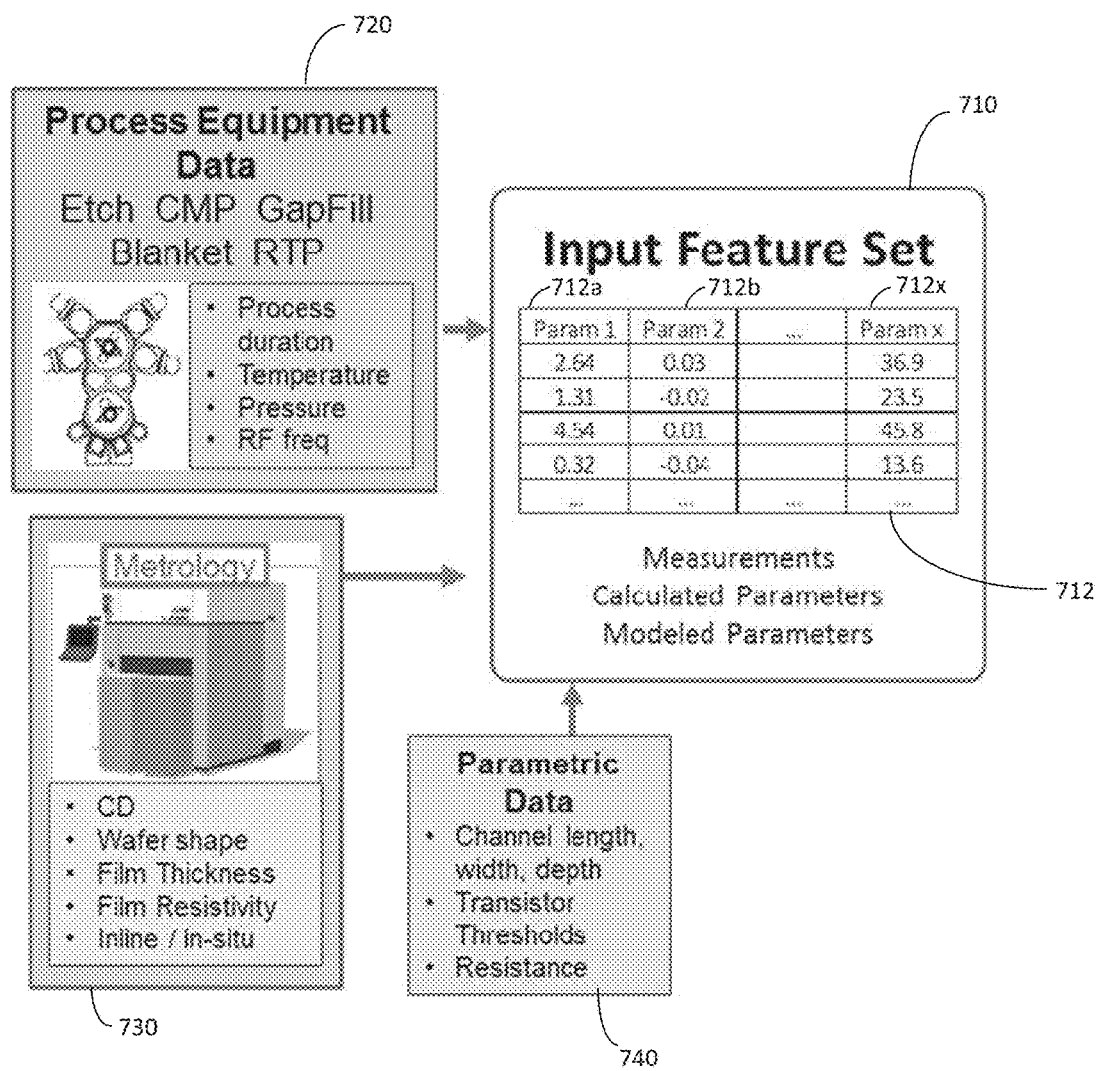
FIG. 7 is a block diagram illustrating examples of input data and the sources for input data.

FIG. 7 illustrates one example of collecting input data for an input feature set 710, which is a matrix 712 having a number of input parameters 712a, 712b . . . 712x, which are relevant to a specified target, which may be a measurement, a calculated parameter, or a modeled parameter. The input data may be collected during wafer fabrication, at or before wafer test and sort and/or wafer probe testing. For example, input data can be collected from the process equipment 720 during steps for etch, CMP, gap fill, blanket, RTP, etc., and may include process variables such as process duration, temperature, pressure, RF frequency, etc. Input data may also include metrology data 730 such a CD, wafer shape, film thickness, film resistivity, inline or in-situ measurements, etc. Input data may also include parametric data 740 such as channel length, channel width, channel depth, transistor thresholds, resistance, etc.

Figure 8:
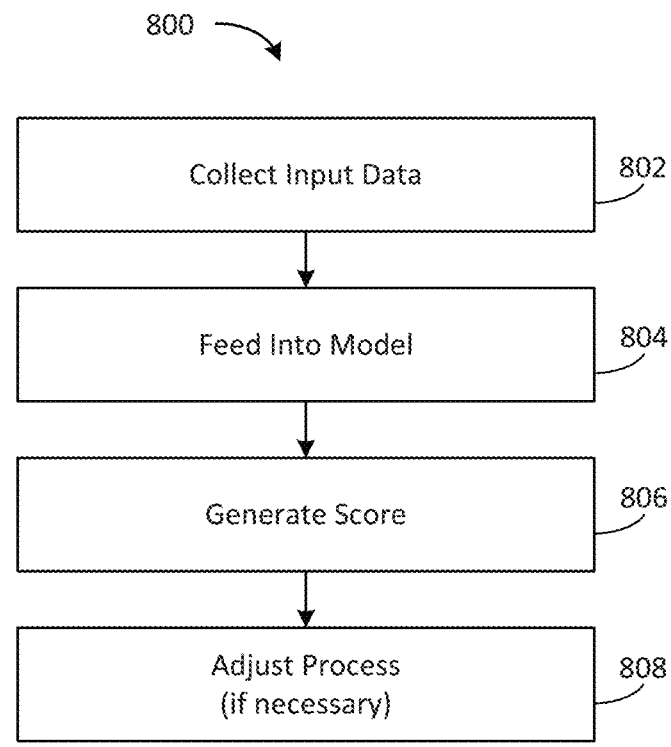
FIG. 8 is a flow chart illustrating a method for using a deployed model to make process adjustments.

FIG. 8 illustrates use of the model. In step 802, specified input data is collected, e.g., as an input vector, then fed into the model in step 804. If some of the specified data is not present in the 1×n vector, there are a number of techniques that can replace or estimate the missing data in the input vector.

For each input vector of size 1×n fed into the algorithmic model, a score will be generated in step 806. The score is a prediction of the target made by the model, given the input data. The score generated by the model will correspond to whatever metric was used as a target for training the algorithm that generated the model. For example, if a DBO measurement was used for the target to train the algorithm, then the score will be a predicted DBO measurement. If the target was a parametric test value, then the score will be a prediction of that parametric test value. In a typical situation, the score can be the overlay offset prediction, for example, an offset in the x direction or the y direction. In step 808, the score is used to determine an adjustment to be made to one or more components of the lithographic apparatus. For example, the offset data could be applied to a control system to make an adjustment to the lithography apparatus parameters or "control knobs" to adjust for the overlay error.

In addition to the score, the model can also output a confidence metric that describes how reliable the score prediction is. This can be useful in determining whether or not to employ the score, or weight the use of that prediction in conjunction with other traditional measurements. For example, if the predicted offset is 3.0 nm, the DBO measured offset is 6 nm, and there is a confidence of 0.8 (out of 1.0) in the prediction, then the final predicted offset would be:

$$(3.0*0.8)+(6.0*0.2)=3.6 \text{ nm}$$

As previously discussed, the convolution of CD error and overlay error can affect device performance. In order to optimize the device performance, it may be necessary to adjust the overlay for a given CD. In one embodiment, machine learning algorithms could be used with all or some of the above mentioned input data, along with CD error measurement and overlay error measurement to create a model whose target is a lithography apparatus control parameter, such as focus, power, or x-y direction control. The goal is to optimize the lithography apparatus control parameter (given a measured CD) such that the lithography apparatus output results in the best semiconductor device performance or yield.

As new input data and corresponding target data is generated, the algorithm can be retrained so as to produce a better model that will give better scores. A set of algorithms can be trained simultaneously with the same input and target dataset. The algorithm that gives the best output can be the algorithm that is ultimately deployed. Alternatively, an ensemble of algorithms can be identified as the best algorithm to be employed. The best algorithm is identified by whichever algorithm gives the best results through means of a validation test on the training dataset. For example, k-means cross validation is a popular technique for validating algorithms.

As noted above, the input dataset should undergo preprocessing. The preprocessing step can improve the quality of the input dataset and increase the accuracy and precision of predictions made by the model. In some embodiments, other data preparation techniques can be applied to the input data, such as normalization or parameterization of the data.

Additionally, a z-score can be generated to compensate for drift and shift in the data. For example if a tool is calibrated, the input data may shift. If a shift occurs, this may change the overall mean and standard deviation of the input data, which would generate poor results with the model. Either a human or algorithm can signal when a shift occurs, such as when a process tool undergoes calibration, and the data can be collected for a period of time in a "listening mode" (algorithm prediction is not applied to product) after the calibration to ensure there are not faulty predictions. After a certain period of time, a z-score is generated from that data. The z-score should be similar to the z-score of the data that occurred before the calibration. This is an example of normalizing the data before and after a calibration has taken place.

In some embodiments, virtual metrology predictions generated from upstream process equipment and metrology data can be used as inputs to the model. This essentially represents a multi-step model or algorithm, where first the virtual metrology predictions are determined by a first algorithm. For example, the outputs can be used as inputs to another algorithm designed for overlay error compensation, overlay error measurement, or yield prediction.

A prediction by the algorithm can be made after all testing and manufacturing is complete on the product. In a typical situation, the goal is to predict if the product will fail after shipping and/or is in use, even if the product has passed all final testing successfully.

The algorithm can be a classification or regression algorithm, which are types of machine learning algorithms, but could be one of many different types of algorithms. Examples of some of these algorithms that can be used include: Decision Trees, CART (Classification and Regression Trees), C5.0, C4.5, CHAID, Support Vector Regression, Artificial Neural Networks, Perceptron, Back Propagation, Deep Learning, Ensemble, Boosting/Bagging, Random Forests, GBM (Gradient Boosting Machine), AdaBoost.

In some embodiments, the best algorithm may not be a single algorithm, but can be an ensemble of algorithms. An ensemble of algorithms can use different techniques to determine which algorithm or combination of algorithms gives the best prediction. For example, an ensemble algorithm can take the average recommendation from all of the algorithms in the ensemble. In another example, an ensemble algorithm can use a voting scheme to make the final recommendation. The ensemble algorithm can use different weighting schemes applied to a collection of individual algorithms in order to produce the best prediction.

In particular, good predictions have been produced using the GBM (Gradient Boosting Machine) and Random Forests algorithms.

The score is a prediction made for each input vector fed into the model when the model is deployed. For example, if the goal is to predict whether or not a wafer will be identified as "good" at wafer test, the input vector can consist of all input data associated with that wafer and that input data will be fed into the model to make the prediction.

In some embodiments, the model can also output a confidence metric that can describe how reliable the score is. This can be useful in determining whether or not to employ the score, or to optimize final testing, or to calculate burn-in time, or it could be used in a final yield prediction. In the case of a multi-step algorithm, the confidence metric can be used as an input to a subsequent algorithm.

A propensity metric can also be generated when the algorithm is a classification algorithm, and in one embodiment, will have a value between 0 and 1. As an example, if the propensity value is near 0, then the likelihood is that a prediction is one classification (e.g., FALSE). If the propensity value is near 1, then the likelihood is that a prediction is the other classification (e.g., TRUE). The propensity metric can indicate how confident the algorithm is in making the given prediction, i.e., the closer the propensity metric is to either 0 or 1, the higher the confidence that the prediction is correct. In the case of a multi-step algorithm, the propensity metric can be used as an input to a subsequent algorithm.

In an embodiment, as new input data and corresponding target data is generated, the algorithm can be retrained so as to produce a better model that will give better scores.

In some embodiments, a set of algorithms can be trained simultaneously with the same input and target dataset. The algorithm that gives the best output can be selected for deployment.

In one example, algorithms can be applied to the processing and manufacturing of finFET structures. Flowable gap-fill film material properties are variable, which affects the film density and its optical properties. This can confuse optical metrologies used to measure and control film thicknesses, leading to erroneous film thickness measurements. In the fabrication of finFET's, this can lead to erroneous measurement of the gate height, and thus cause the gate heights to be variable. Variable gate height can lead to increased gate capacitance, leakage, and a need for higher drive current. Thus, inputs to the algorithm(s) can be etch process parameters, flowable CVD process parameters, CMP process parameters, oxide metrology outputs, TEM's, and yield results. The algorithms can be used to either detect and fix problems with the etch process, flowable CVD process, and CMP process.

Etch depth can play a big role in the determination of gate height. Etch process can also influence gate sidewall angles, which can have an effect on gate performance and the optical metrology signature. In some embodiments, etch process parameters can either be used as input parameters to the above models to detect problems or control the CMP process, or can be the target for control. The algorithms can control the process, detect process issues, and achieve tighter gate specs. In some embodiments, the etch process parameters can be used as inputs in determining the lithographic tool control. Etch tool process parameters can be used to predict the etch rate or final etch depth, as in the case of virtual metrology. The outputs of the virtual metrology algorithm can then be used as input to the lithographic tool control, for example, as an intermediate step algorithm.

Algorithms can also be applied to the processing and manufacturing of 3D-NAND, or vertical NAND memory structures. To form vertical NAND (3-D NAND) structures, semiconductor manufacturers use alternating layers of oxide and nitride or oxide and conductor layers. These stacks can be a very thick, such as 2 um high, and are continuing to scale thicker. This results in high stress, delamination, and cracking.

To address the stress issues, algorithms can use as inputs the process parameters (e.g., gas flows, temperature, process cycle times) of the blanket deposition of these films, as well as the in-situ and inline metrologies (including broadband light metrologies) used to measure these film stacks. Without explicitly having to apply any physical modeling, correlations can be found between yield/inspection/stress tests and the inputs mentioned above to immediately identify problems with the blanket deposition.

3-D memory characterization and failure analysis presents many challenges, and there is a great need for better characterization. Currently, TEM and x-ray techniques are used, but are low throughput and may result in material state change. Further, correlating probe failures and inline defect inspection is difficult due to the fact that many defects are embedded. E-beam inspection is increasingly being used to identify structural defects, but incurs additional cost. In some embodiments, gap fill process parameters are used as inputs to the algorithm(s). E-beam 3D inspection can also be used as targets for the algorithm.

5. Process Example for Overlay Error

An overlay process can be performed on one or more training wafers, and the training wafers are then analyzed for actual overlay errors. The most accurate way to measure overlay error is CD-SEM or TEM. All available wafer geometry parameters, such as thickness, diameter wafer shape variation, in-plane displacement, stress-induced local curvature, wafer thickness and flatness variation, front and back surface nanotopography (NT), wafer edge roll-off (ERO), sliplines; scanner parameters such as translation (x,y,z), rotation (x,y,z), focus tilt, dose error, focus residual, magnification, asymmetric magnification, asymmetric rotation; CD measurements such as film thickness, trench depth, metal gate recess, high k recess, side wall angle, resist height, hard mask height, pitch walking; film property parameters such as refractive index and absorption coefficient (n & k optical constants); parameters of other overlay measurements such as DBO and IBO (can also include the intensity values of the diffraction signature along with the DBO measurement itself), are used as inputs to the training model, with the corresponding actual overlay error as the target. The location on the wafer of the actual overlay measurement is matched with the location of all of the input parameters for that site, where applicable. Some process parameters such as temperature, pressure, process duration, etc. and other tool-related parameters are collected on a per-wafer basis and cannot be mapped specifically to a site. Rather, all sites for a given wafer will contain the same values collected for the wafer when site-specific information is not applicable or available. Alternatively if the spatial resolution of the overlay error measurement is greater than the spatial resolution of a given input parameter (e.g. a 9-site CD measurement on a wafer), then the closest input parameter will be mapped to that actual overlay error measurement. A good technique for doing this is k-means clustering. Other techniques include interpolating (3-D) to determine the value of the input parameter or cubic spline.

Figure 9:
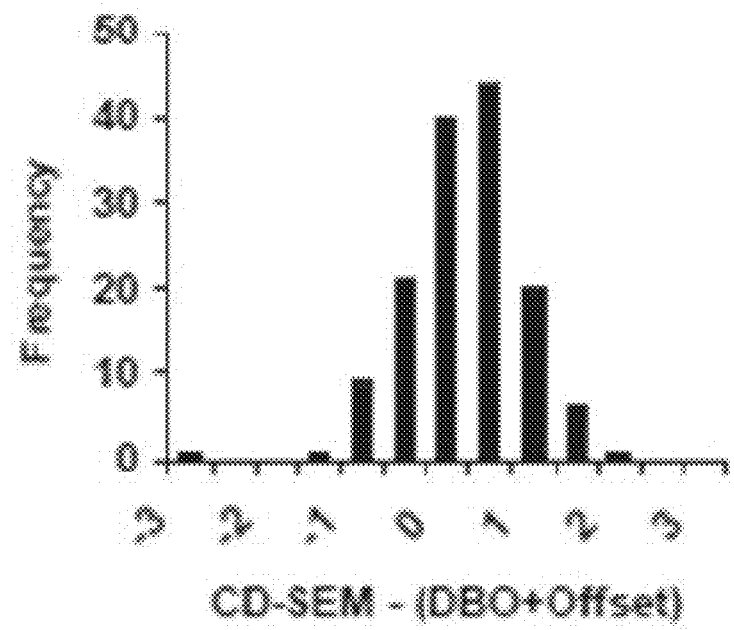
FIG. 9 is a graph showing the error between a DBO measurement and a CD-SEM measurement.

It is generally known that DBO and IBO are not perfect techniques for measuring overlay due to process and geometry influences. For example, FIG. 9 shows the error between DBO and a more-accurate CD-SEM representation of overlay, for 143 measurements. If DBO parameters (such as intensity at each wavelength of the diffraction spectra are included in the input dataset, along with the DBO predicted measurement, it is possible to correlate the error shown in FIG. 9 to process parameters of the lithography tool.

One approach specifies the target as the delta between the DBO measurement and CD-SEM measurement. The error associated between DBO and CD-SEM or TEM can be attributed to an input dataset and corrected in production.

Once the training input data set is organized, it is cleansed. The training input data may have corrupted values, in which case the corrupted values are removed and replaced with blanks or null values. The dataset may also contain inconsistent values for various informational features such as lot or wafer ID. For example, a lot description may appear as "lot A" in some cases and "lot.A" in other cases. These values will all have to be converted to the same nomenclature, for example "lot.A."

The input data is then normalized or transformed. For example, in the case of tool calibration, the data may need to be mean shifted. A z-score can also be calculated from the input data set for different populations or distributions within a given input data set. For example, if a portion of an input is collected for a given tool calibration between time A and time B, then that data is normalized or a z-score is generated for the portion of data. If a different tool calibration is used between times B and time C, then normalization or z-score generation is performed for that portion. The result is a complete dataset that is insensitive to tool calibration. Events other than tool calibration that can generate the need for data transformation are upstream process changes and consumable changes. It is important to note that the same transformation will need to be applied once production commences. To gather enough data in real-time production in order to make the transformation, predictions may not be applied until a user-specified amount of data is collected in order to make transformation. However, it may be determined that the transformed data is not an important feature for the model.

The training dataset can be partitioned into training, testing, and validation portions to ensure a robust model is built that is not over-fit or over-biased. A typical partition can be 60% training, 30% testing, and 10% validation. For some models, such as boosted or bootstrap-aggregated models implemented in analytics platforms such as IBM SPSS Modeler, the testing and validation sets need to be separated as the testing dataset is used to further optimize the model while the validation set is completely blind to any model training or optimizing activity. For other types of models, such as standard linear regression, it is acceptable to separate the partitions into training and testing only. It is important to note that techniques such as k-fold cross validation can be employed during the model building phase to ensure the model is not over-fit to any given training set. This involves rotating the training/testing/validation portions of the dataset to ensure that all data sees a training or testing portion.

If a given input has a large number of missing or corrupted values, then that input feature may be removed from consideration in training the model. For example, if more than 50% of the data is not present for a given input feature, then that input feature can be thrown out. Alternatively, the missing data fields may be filled in with nominal values, or the records that do not contain values may be completely removed from the training dataset. A determination of which technique to use can be decided based on a human judgment of the importance of a given input feature.

That dataset may also have to be merged for a given key. The key typically is an x-y coordinate on the wafer or scanner, or could be a die number. As mentioned above, datasets may need to be mapped to a given key (cubic spline, interpolation, or nearest neighbor). The location on the wafer, such as a specific die or its location, is matched with the location of all of the input parameters for that site, where applicable. Some process parameters such as temperature, pressure, process duration, etc. and other tool-related parameters are collected on a per-wafer basis and cannot be mapped specifically to a site. Rather, all sites for a given wafer will contain the same values collected for the wafer when site-specific information is not applicable or available. Alternatively, if the spatial resolution of the die location is greater than the spatial resolution of a given input parameter (e.g., a 9-site CD measurement on a wafer), then the closest input parameter will be mapped to that actual die. A good technique for doing this is k-means clustering. Other techniques include interpolating (3-D) to determine the value of the input parameter or cubic spline.

A training input dataset may contain thousands of input features, and a relevant set of input features may need to be determined. A process for removing irrelevant input features that weakly correlate to overlay error may need to be implemented. As a first step in this process, input features that do not change at all can be removed.

There are also a number of approaches to feature selection. One approach is implementing random forests which identify which input features are most relevant to predicting overlay error. Another technique is the CHAID decision tree, which will also identify features that are important. Linear regression is another technique. ANOVA is another technique.

Alternatively, dimensionality reduction can also be employed. Common dimensionality reduction techniques include partial least squares and principal component analysis, which will create a new smaller set of input parameters based on the large set of initial input parameters. For example, an input set of 5000 features can be reduced to an input set of 30 newly-generated principle components that can explain a significant portion of the variance in the data. The outcome or output of the dimensionality reduction step can be used as new inputs to the model. For example, the principle components generated by PCA can be inputs to the model. The principle components will represent a reduced set of inputs from a larger set of inputs.

From the original input data, a set of virtual metrology models may be constructed. The purpose of a virtual metrology model is to predict a key metric in the semiconductor fabrication process. For example, an etch depth may be predicted given certain upstream variables such as etch tool process parameters, previous step thickness and process variables such as deposition tool process parameters, CMP process parameters, and optical n and k values of the film. In some embodiments, the etch process parameters can be used as inputs in determining the lithography tool control. Etch tool process parameters can be used to predict the etch rate or final etch depth (as in the case of virtual metrology). The outputs of the virtual metrology algorithm can then be used as inputs to the lithography tool control as an intermediate step algorithm. The output of the intermediate step algorithm (or virtual metrology algorithm) can be used as an input variable for the determination of overlay error.

Certain parameters in the models are important in determining the best model, of which certain variations can be tried. The best combination of model parameters that gives the least error between predicted and actual overlay error is chosen. For example, the minimum number of records allowed in a decision tree leaf can be set, or the number of weak learners employed in a random forest algorithm or GBM model, or the number of input features for each weak learner in a random forest algorithm.

The candidate model predicts the overlay errors and compares them with the actual overlay errors on the validation wafers. If the prediction accuracy satisfies certain thresholds based on the overlay budget and other considerations, the candidate model is considered to be valid and ready to be deployed to predict overlay errors on other production wafers which share similar processing conditions with the training and validation wafers.

Once a model or multi-step model and associated parameters are chosen, the model is first implemented in production in a "listening mode" where overlay error predictions are made as wafers run through production. The predicted overlay error can be compared to actual overlay error. If the predicted error is found to be within a user-defined threshold or overlay error budget, then the production is allowed to continue to run and more data is collected.

If instead the model is not predicting within the defined limits as compared to actual measured overlay error, then all data collected up to that point is used to retrain the model as outlined in the above steps. If the model now predicts a result within the user-defined thresholds after being retrained, the model is then re-deployed in listening mode in production. If the model performs within the specified error limit (predicted–actual overlay) for a user-specified period of time (for example, 8 weeks of production), then the model is allowed to replace some of the actual overlay measurements used in actual production. Over time, if the model continues to perform well, more and more product will rely on the predicted overlay, until the overlay prediction is used on all production.

The model will continue to be re-trained at user-defined intervals (for example, once a week) as new data is made available. To retrain the model, the entire dataset available may be used. It may also be beneficial to use only the latest data available for a period of time to train the model, for example the last 3 months only, and discarding very old data as it becomes obsolete as the process undergoes significantly shifts. It may also be beneficial to retain for model training older data that defines the extremes of the input and target variance, and discard older redundant data to maintain model training efficiency or save memory space. It may be beneficial to continue to monitor the performance of the predicted overlay, even after full production release, by continuing to compare to actual overlay measurements. If it is found that the error between predicted and actual overlay falls out of tolerance, then predictions will not be deployed for a period of time until it is determined why the predictions fell out of tolerance and the model is retrained and gradually released back into production.

Once a candidate model is determined, one or more validation wafers are selected from the production wafers, and patterned wafer geometry parameters are obtained for the validation wafers using a patterned wafer geometry metrology tool. An overlay process is performed on the one or more validation wafers and the one or more validation wafers are analyzed for actual overlay errors. The candidate model predicts the overlay errors and compares them with the actual overlay errors on the validation wafers. If the prediction accuracy satisfies certain thresholds based on the overlay budget and other considerations, the candidate model is considered to be valid and ready to be deployed to predict overlay errors on other production wafers which share similar processing conditions with the training and validation wafers.

Once the candidate model is validated, the remaining production wafers are scanned with a patterned wafer geometry metrology tool to determine wafer geometry parameters. Based on the wafer geometry parameters and the deployed predictive model, the system predicts an overlay error for the remaining production wafers and adjusts the lithography scanner to correct for the predicted overlay error. Point-to-point prediction is crucial for feeding forward the predicted overlay, applying the adjustment, and hence reducing the actual overlay error after the exposure.

6. Yield Prediction

Predicting yield is generally important in the manufacture of semiconductor devices, and even more so as the fabrication of semiconductor devices becomes increasingly expensive. A yield prediction can be made at different steps in the process.

If yield can be accurately predicted at any stage of the manufacturing process, then it becomes possible to optimize and save costs in later processes. For example, if a device can be predicted to be bad before wafer sort and test, then further testing and processing of that device can be avoided thus saving further processing costs. Typically, there are hundreds of steps in a semiconductor manufacturing process. The process for fabrication of wafers can take 2 to 3 months before moving on to the post-fabrication stages, which usually include wafer test and sort, assembly/packaging, final testing, and burn-in. At each of these steps, a predicted yield can be calculated. The fabrication yield can be measured as the ratio of good wafers that make it through the wafer fabrication process to all wafers that entered the given process. The wafer test yield can be calculated as the ratio of non-defective chips determined at wafer test to all chips that entered into wafer test. The assembly and packaging yields are calculated in a similar manner, i.e. the ratio of good chips out to the total chips into those respective processes.

Existing techniques for yield prediction have been based primarily on a univariate analysis. For example, Markov chains predict whether a chip results in positive yields given the number of defects. However, multivariate analysis has become more popular as the amount of test data has become very large. A common technique employed for multivariate analysis is discriminant analysis, but this technique assumes that the data is normally distributed and independent, which is not always the case.

Further compounding the need for multivariate analysis is the fact that the amount of data that is accessible in the semiconductor manufacturing process continues to grow. However, the use of machine learning algorithms, data mining, and predictive analytics make the handling of large data sets manageable. Furthermore, confidence and propensity metrics associated with many machine learning algorithms can be used to optimize wafer sort/testing, final tests, and burn-in activities.

For semiconductor manufacturing, the measure of defective parts per million (DPPM) is evaluated when testing the outgoing packaged chips. In a typical situation, functional/structural test patterns are used at wafer sort and also after the parts (or products) are packaged to determine which products/die are faulty. Functional system level testing then follows. The expense of testing at each subsequent stage can be significantly higher than at the previous stage. Usually, packaged products are tested in burn-in chambers and on load boards, using either the same structural patterns used at wafer sort or with functional test patterns. The cost of such testing has increased significantly over the past several years as design complexity has increased.

A typical business model for manufacturing microchips is the foundry/fabless model, where wafers are fabricated at a foundry and then passed off to the fabless design house or packaging partner for subsequent processing and testing. The term "known good die" (KGD) refers to die at or before wafer sort/test which have been tested to the same quality and reliability levels as their packaged counterparts. If a die passes at the wafer sort/test phase but is found to be faulty at some point after wafer sort, then the design house or packaging house can incur the cost of any steps taken in manufacturing the product after wafer sort. In one business model, dies from the foundry that pass wafer sort are bought by the fabless design house. If the die are found to be faulty after packaging, then the design house pays for those die. This can get very expensive for dies that go into stacked IC's or multi-chip modules, as all dies in the packaged chip would have to be scrapped if only one of the die were found to be bad.

Thus, it has become very important to know at the earliest stage possible if a die will be functional after it is packaged. If post-package yield can be more accurately predicted at wafer sort, or at various stages of final test, or pre burn-in, it can significantly reduce the costs incurred by whichever entity owns the faulty product post-packaging. Also, prediction and confidence metrics can be determined and can be used to optimize burn-in times, which can result in significant cost savings.

In general, yield prediction for a product refers to the prediction of the quality or usability of the product. In one embodiment, yield prediction can be one of two values, namely, either "pass" or "fail" (or "good" or "bad" or "usable" or "not usable"). For example, if the yield prediction for a product is "pass" at a given manufacturing step, then that product is predicted to be usable as of that manufacturing process and should continue processing. If the yield prediction is predicted to be "fail," then that product is predicted to be faulty or not usable as of that manufacturing step and is not recommended for continued processing. The yield prediction is thus useful in determining if it is cost effective to continue processing of a product. In some embodiments, the yield prediction is a component in deciding whether or not to continue processing of the product. The yield prediction is not necessarily the only variable in making a decision about whether or not to continue processing of a product.

This disclosure describes novel techniques for predicting yield before, during and after wafer sort. These yield predictions can be used to reduce costs by more accurately predicting yield at wafer sort, final test, burn-in, and other post-wafer sort testing. Yield predictions and their associated confidence metrics can also be used to make decisions about which tests to perform after wafer sort. Yield predictions can also be used to optimize and reduce burn-in time.

In one embodiment, yield prediction can be the prediction or outcome of a classification system or algorithm. The classification system or algorithm can determine if the product will be functional or non-functional after all manufacturing steps are complete, given an input dataset to the algorithm. For example, if the classification system or algorithm predicts the product will be functional, then it can be said that the yield prediction is positive, or that the product will yield. For example, a "0" may be assigned to indicate a passing/functional product, while a "1" may be assigned for a failing/nonfunctional product.

As discussed with regard to overlay error, the classification system or algorithm used to make a yield prediction can also provide a confidence or propensity metric along with a pass or fail classification, given the input data to the algorithm. The confidence or propensity metric can be a value in a defined range or an undefined range. In a typical situation, the value can be a real number between 0 and 1. In this example, if the value is close to 0, then the confidence is low. If the value is close to 1, then the confidence is high.

A threshold can be set for the confidence value to bin the confidence value as high or low. For example, if the confidence metric varies between 0 and 1, and the threshold is set at 0.5, then confidence values above 0.5 will be deemed as high confidence, while values below 0.5 will be deemed to be low confidence.

Figure 10:
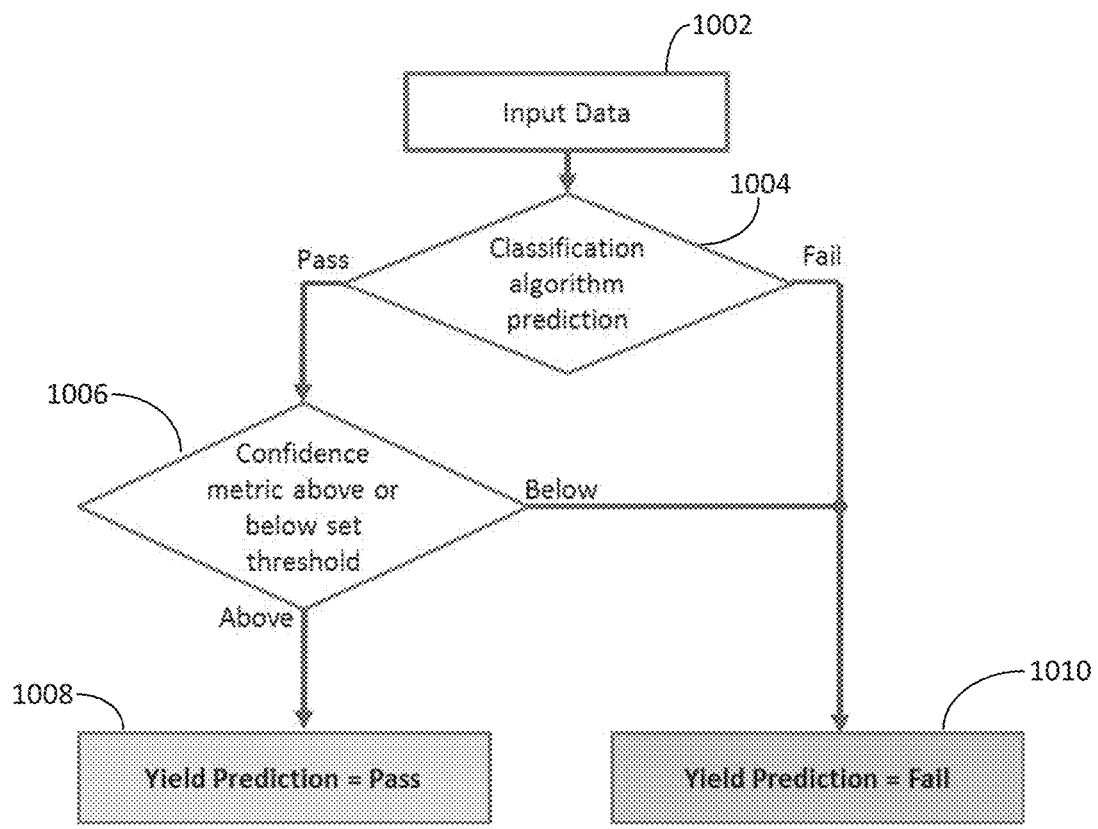
FIG. 10 is a flow chart illustrating yield prediction using a classification algorithm and a confidence metric.

The confidence or propensity metric may be used in conjunction with the pass or fail classification to make the final yield prediction, as illustrated in FIG. 10. Data is input to the classification algorithm in step 1002. If in step 1004 the classification algorithm predicts that the product will pass, and the confidence metric is high for the classification prediction in step 1006, then the yield prediction in step 1008 is said to be positive meaning there is a high confidence that the product will pass.

However, if the classification algorithm predicts in step 1004 that the product will pass, but the confidence value is low in step 1006, then the yield prediction in step 1010 is negative so as to not produce any false positive outcomes. In some situations, a false positive of this nature is very undesirable, as products that are actually faulty but predicted to be good can be very costly for the manufacturer.

Figure 11:
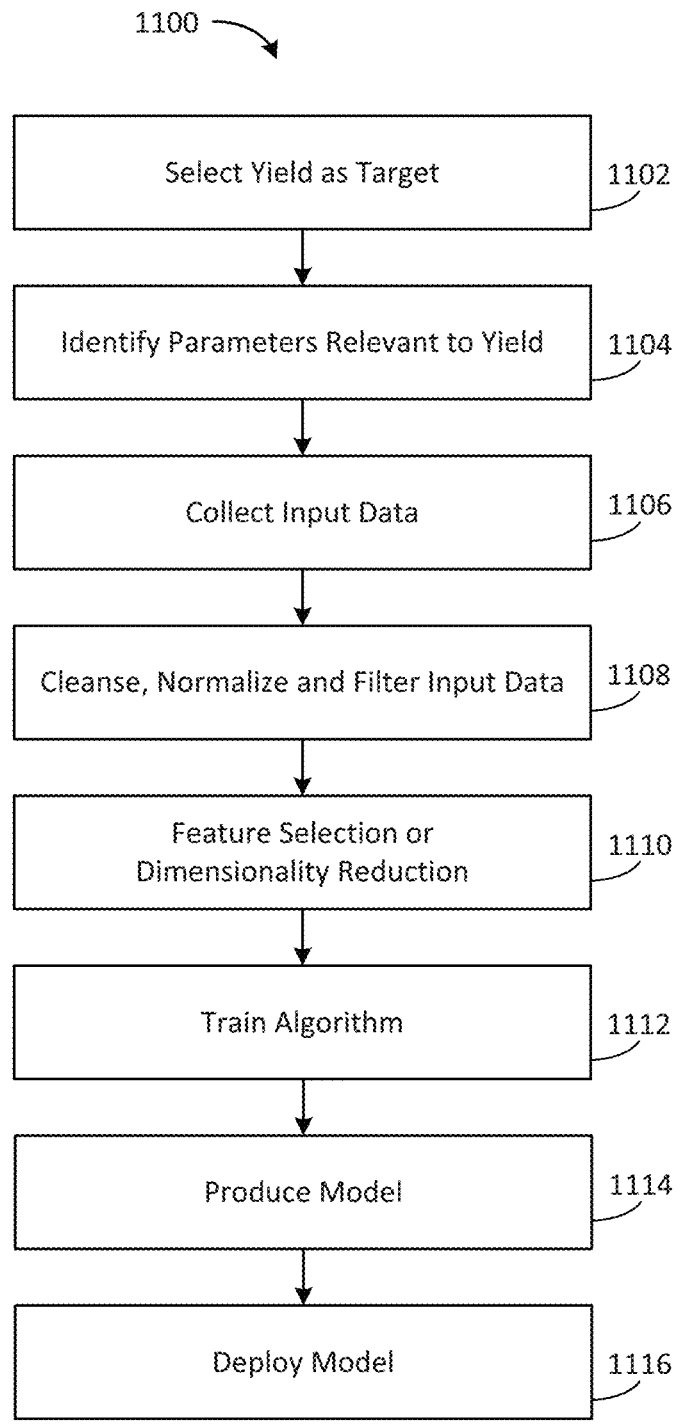
FIG. 11 is a flow chart illustrating a method for training and deploying a model to predict yield.
Figure 12:
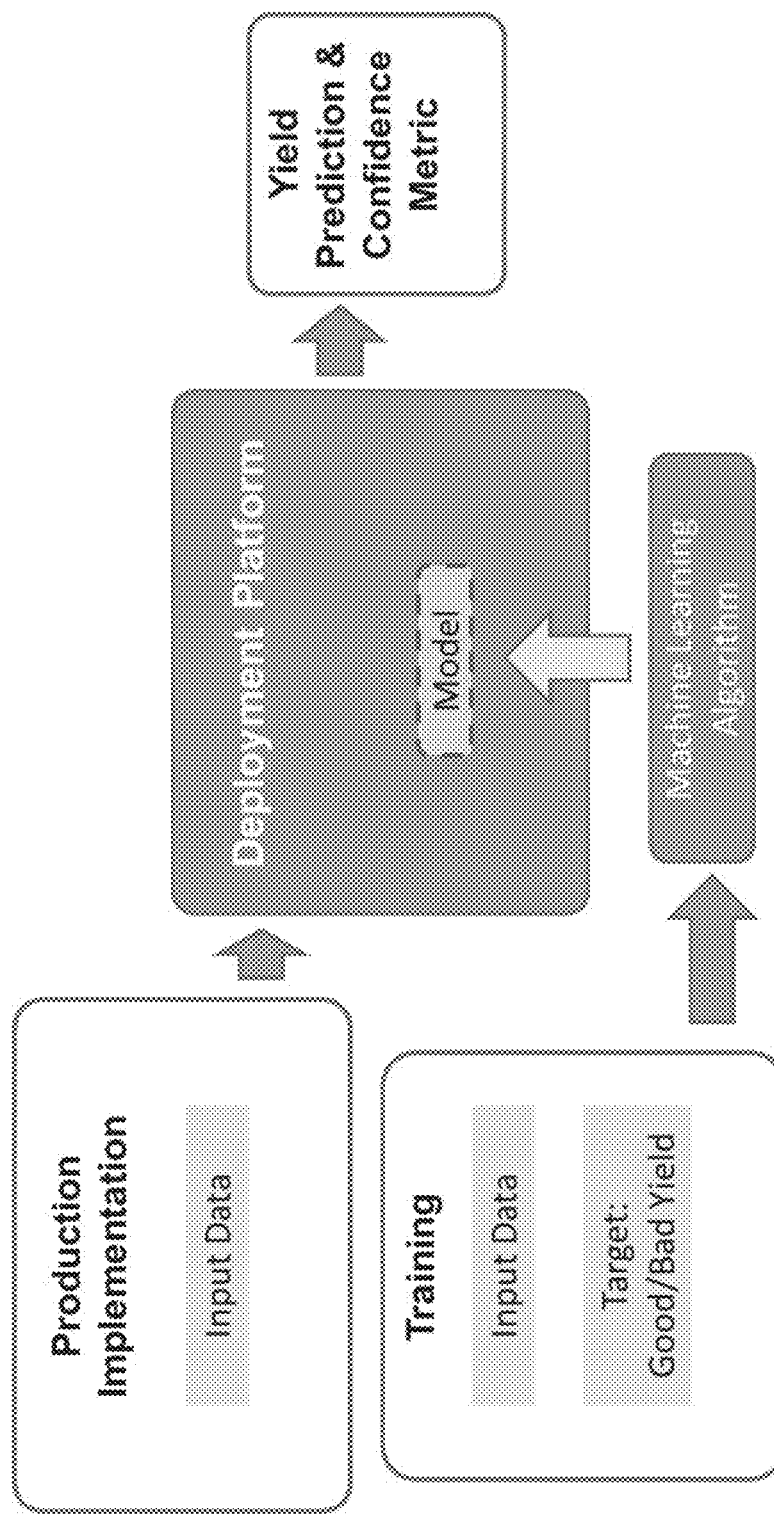
FIG. 12 is a block diagram of one embodiment of a yield prediction system.

Similar to the discussion of predicting overlay error above, a yield prediction can be made by implementing machine learning, predictive analytics, and data mining algorithms (all of which will be referred to as algorithms). The types of input data identified in the overlay sections are also relevant to predicting yield and evaluation of other targets. Further, the techniques and examples described in the overlay sections above are incorporated by reference here as well since they are also relevant to predicting yield or evaluating other targets. Thus, the techniques described for identifying input data, collecting input data, transforming the input data, training and re-training the model, and deploying the model, are applicable to yield prediction and evaluation of other targets. FIG. 11 illustrates a method 1100 for creating and deploying a model to evaluate a semiconductor manufacturing process in order to predict yield. In step 1102, a target is selected. In one embodiment, the target is total yield for the entire manufacturing process. In another embodiment, the target is yield for an individual process step. The target could be yield for an individual die on a wafer, or the entire wafer. The target could also be the yield of a packaged chip or product at final test, before burn-in, or a packaged chip or product at final test, after burn-in.

In step 1104, the parameters that are useful in evaluating yield are identified, and in step 1106, input data relevant to the parameters is collected. Every set of input data is associated with a specific output or target. For example, a set of measured and observed values are associated with actual yield values, and those values are provided as an input vector to the model.

In general, the input data to the algorithm can be input data from any or all processes performed during wafer fabrication. Wafer level data from the semiconductor fabrication processes and metrology that are collected before wafer sort and test can be used as part or all of the total inputs to the algorithm. These input parameters can include metrology measurements from process steps or metrology measurements collected during the wafer fabrication process. These measurements can include optical reflectometry or ellipsometry data, and the intensity of each measurement at a given wavelength. The metrology data can be incorporated from a reflectometry measurement taken after a certain processing step (for example, CMP or Etch, or Gap Fill processes). The metrology measurements can also be produced by non-optical measurements, such as Rs (conductivity, resistivity) measurements taken by probes and other types of contact measurements, or contact measurements such as the HRP or high resolution profiler.

In some embodiments, part or all of the input data can be from the output of wafer probe tests, or measurements made by wafer probe tests. Additionally, data from final wafer electrical testing, wafer sort tests, and wafer acceptance tests can be used as input data. Examples of final wafer electrical testing parameters include, but are not limited to, diode characteristics, drive current characteristics, gate oxide parameters, leakage current parameters, metal layer characteristics, resistor characteristics, via characteristics, etc. Examples of wafer sort parameters include, but are not limited to, clock search characteristics, diode characteristics, scan logic voltage, static IDD, IDDQ, VDD min, power supply open short characteristics, ring oscillator frequency, etc.

The input data can come from a final test. The input data can come from tests that occur multiple times under different electrical and temperature conditions, and before and after device reliability stresses, such as burn-in, or tests that occur at a burn-in step. The input data can come from electrical tests that are a mix of functional, structural and system-level tests.

The test outputs which can serve as inputs to the yield prediction system can be of binary type (pass/fail) or can be analog, or a real number that can be bounded or unbounded. The analog output can be a voltage reading, or a current reading.

In step 1108, the input data undergoes filtering, normalization and/or cleansing steps. In step 1110, dimensionality reduction or feature selection is performed to reduce the number of input parameters for processing the algorithm.

In step 1112, the data is then fed into one or more algorithms for training. Given the training input data and training targets, the algorithm(s) will produce a model in step 1114, which can be deployed in step 1116 to act on real time data.

In one embodiment, the status of the manufactured product can be the result of a function that weights the results of final tests, the confidence metric of the yield prediction system, and the classification of the yield prediction system, as illustrated in FIG. 13. If the status prediction is above a specified threshold, then the part can be determined to be good, or usable.

In an embodiment, the algorithm utilizes calculated propensity from an upstream test which contains more failures to determine the failure rate of the final test, which may contain much fewer failures. For example, at the end of an upstream testing process, the failure rate may be higher, which would make it easier to produce a model that gives more accurate predictions (e.g., a CHAID decision tree). A model can be built to determine the failure rate of this upstream process, and produce a pass/fail prediction along with a confidence and propensity metric. The failure prediction, confidence and propensity metric can then be used as inputs to predict the failure of a test further downstream. This may be particularly useful when the test downstream has a lower number of failures, making it more difficult to build an accurate model.

In some embodiments, a data processing step for a classification model may include oversampling. For example, if there are 100 failed chips and 10,000 passed chips in the training dataset, oversampling would mean replicating the rows of failed chips 100 times so that there are now 10,000 rows of failed chips. This balanced set is then fed into the model. Alternatively, under sampling would mean (randomly) selecting 100 passed chips and feeding that into the model, along with the other 100 failed chips to create a balanced training set. This can be an important step in creating a decision tree.

In some embodiments, limits are set on how small the leaf nodes of the decision tree can be so as not to result in an over-biased or over-fit model to the training dataset.

In some embodiments, the model is trained on a portion of the data. It is then tested on a different portion of the data that is blind to the training phase. K-fold cross validation can also be applied to determine the robustness of the model. In the case of boosted on bagged algorithms, a training, testing, and validation dataset can be partitioned, where the validation set is completely blind while the testing set is used to optimize the model.

The following is an example of a yield prediction algorithm. The input data is cleansed, transformed, and organized as previously described. The input data can be associated with each die, or mapped to a particular die by using the techniques described above. The input dataset can contain a set of die manufactured throughout the manufacturing process with associated input data for each die. Along with each die can be the associated health of the die, i.e., pass or fail. Typically, most of the die will pass but some of the die will be determined to fail after the final testing step. Throughout the final testing process, the die will undergo various tests and reliability stresses (e.g., burn-in), and some of the die will incrementally fail and be removed. The model is a type of classification model that uses the die's health (pass/fail) as a target. The issue with training a model around the die health (pass/fail) at the final stage of the process is that the number of failures is usually very low by this stage. For example, the number of failures after final testing may be only 100 out of 1,000,000. Most classification models will not be able to predict failure accurately with such a low number of failures in the dataset used to train the model. To mitigate this issue, an intermediary model is trained around an earlier upstream test that will have more failures. Balancing techniques such as oversampling are still applied to the dataset since the number of failures will be relatively low as compared to number of passes, for example 10,000 failures out of 1,000,000. From this intermediary model, a propensity metric is generated for all remaining passed die which will continue to undergo subsequent processing. By the time the die reaches final test, the propensity score from the earlier intermediary model is used as an additional input to train the final failure prediction model. The dataset is again balanced (e.g., oversampling) to ensure the number of failures will equal the number of passes in the model training set. The overall accuracy of the model can improve if the propensity of the upstream model is also used as input. Training, testing, validation, and cross validation techniques are applied to determine the best model. Various models are tried in the techniques described earlier. The model that gives the least number of false positives and/or false negatives (depending on which metric is of most importance to the user) will be the model that is selected. Typically, the user will be interested in minimizing false negatives (i.e., predicting a die will pass but in actuality it fails), since this will mean it may be erroneously routed for less stringent testing or burn-in, resulting in a sub-stardard die being shipped to a customer, thus increasing risk of field failure.

7. Testing and Burn-In Optimization

The yield prediction system can be used to calculate and optimize burn-in time. The burn-in time calculation can be a function of the yield prediction or classification produced by the yield prediction system, the confidence or propensity metric computed by the yield prediction system, and/or actual final test results, as illustrated in FIG. 14. As an example, if the yield is predicted to be positive by the yield prediction system, and the confidence metric calculated by the yield prediction system is a relatively high value, then the burn-in time can be calculated to be lower than average, or completely eliminated. In another example, if the product is predicted to be good by the yield prediction system, and the confidence metric is calculated by the yield prediction system to be low, then the burn-in time may be calculated to be higher than average. In another example, if the product is predicted to be bad by the yield prediction system, then the burn-in time can be set to a maximum value.

The yield prediction can also be used to optimize final testing. For example, if the product is predicted to be good with a high confidence value, then certain expensive tests can be skipped. In another example, if the yield prediction is good but the confidence value is low, then more exhaustive testing can be implemented than the case where yield prediction is good and confidence is low. In yet another example, if the product is predicted to be good, a decision can be made to do the most rigorous amount of testing, or the decision can be made to forgo further testing and processing, and scrap the product.

8. Other Applications

As discussed herein, predictive analytics can be used to discover the relationships between the various process steps, parametrics, and product performance, which can then be leveraged to predict and improve product performance. By incorporating the advantages of machine learning and parallel processing, predictive analytics can find complex correlations among the input data that have been difficult to uncover using other techniques. Thus, in addition to predicting yield and correcting for overlay errors and CD variations, as discussed above, predictive analytics can be used in many ways in the semiconductor manufacturing process to improve performance, quality, and yield, and to reduce costs. Algorithms can be used to optimize some or all of the processes in semiconductor manufacturing.

Figure 15:
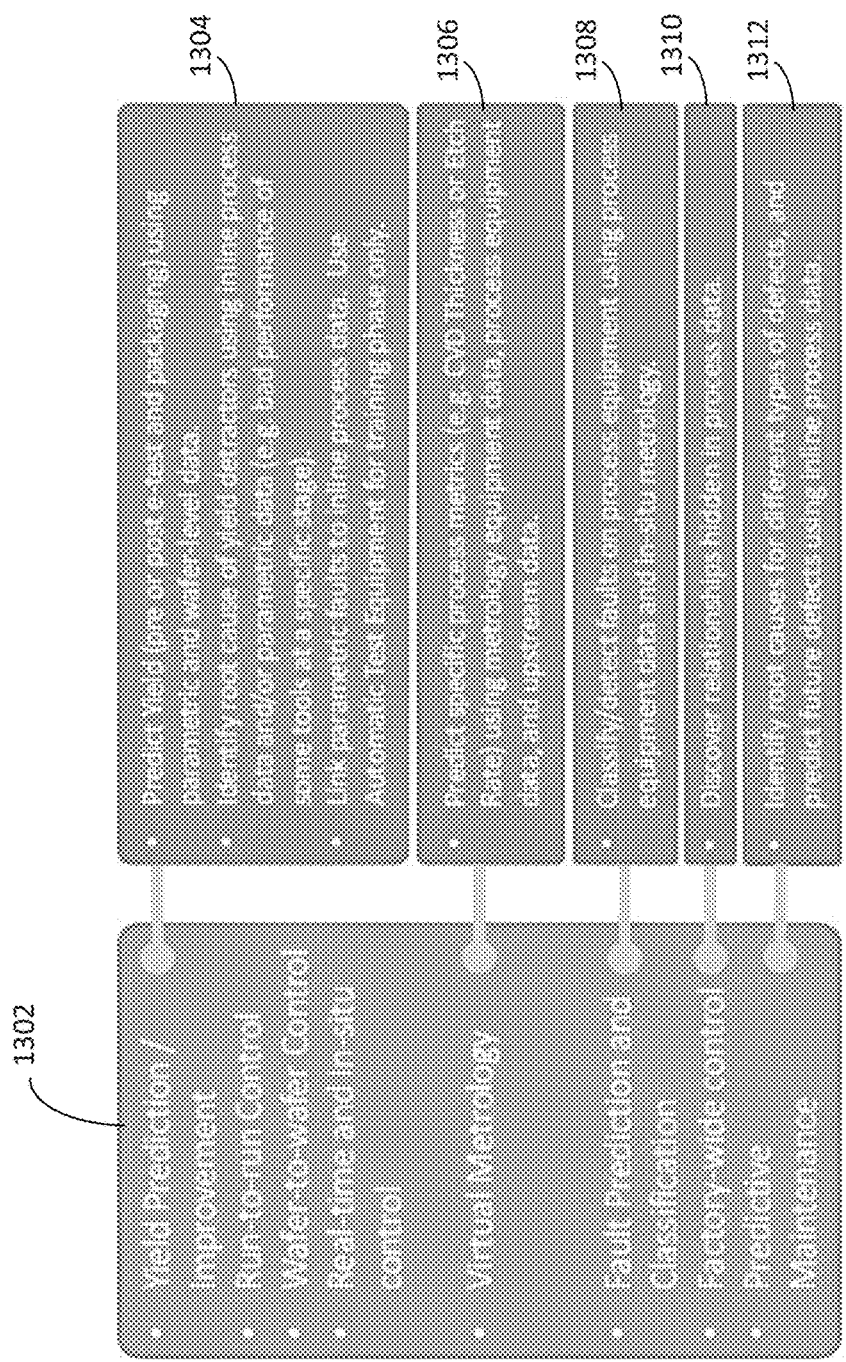
FIG. 15 is a block diagram illustrating additional applications in a semiconductor manufacturing process for predictive analytics.

FIG. 15 illustrates several additional applications 1302 for the techniques described herein, including yield prediction/improvement; run-to-run control; wafer-to-wafer control; real-time and in-situ control; virtual metrology; fault prediction and classification; factory-wide control; and predictive maintenance, among others. With regard to yield, the techniques disclosed herein can predict yield, or identify the root cause of yield detractors, or link parametric faults to inline process data, as shown in box 1304, among others. With regard to virtual metrology, the techniques disclosed herein can predict specific process metrics using metrology equipment data, process equipment data, and upstream data, as shown in box 1306. With regard to fault prediction and classification, the techniques disclosed herein can classify or detect faults on process equipment using process equipment data and in-situ metrology, as shown in box 1308. With regard to factory-wide control, the techniques disclosed herein can discover relationships hidden in the process data, as shown in box 1310. With regard to predictive maintenance, the techniques disclosed herein can identify root causes for different types of defects, and predict future defects using inline process data, as shown in box 1312.

In some embodiments, virtual metrology can use algorithms to predict metrology metrics such as film thickness and critical dimensions (CD) without having to take actual measurements in real time. This can have a big impact on throughput and also lessen the need for expensive TEM or SEM x-section measurements. Based on sensor data from production equipment and actual metrology values of sampled wafers to train the algorithm, virtual metrology can predict metrology values for all wafers. The algorithm can be a supervised learning algorithm, where a model can be trained using a set of input data and measured targets. The targets can be the critical dimensions that are to be controlled. The input data can be upstream metrology measurements, or data from process equipment (such as temperatures and run times).

Identifying a machine fault or failure, and finding the root cause of faults quickly, can be essential in semiconductor manufacturing. If faults in the manufacturing process can be better detected and resolved, downtime and scrap can be reduced. This is also referred to as fault detection and classification (FDC). If faults can be predicted before they occur, then downtime can be optimally scheduled and scrap can be even further reduced. Thus, algorithms can be used to predict when a fault or defect will occur in the manufacturing process or on a specific tool at a process step.

In some embodiments of the invention, algorithms can be used to determine when maintenance needs to be performed on manufacturing equipment. This is referred to as predictive maintenance in the semiconductor manufacturing process.

9. Model Creation and Implementation

Figure 16:
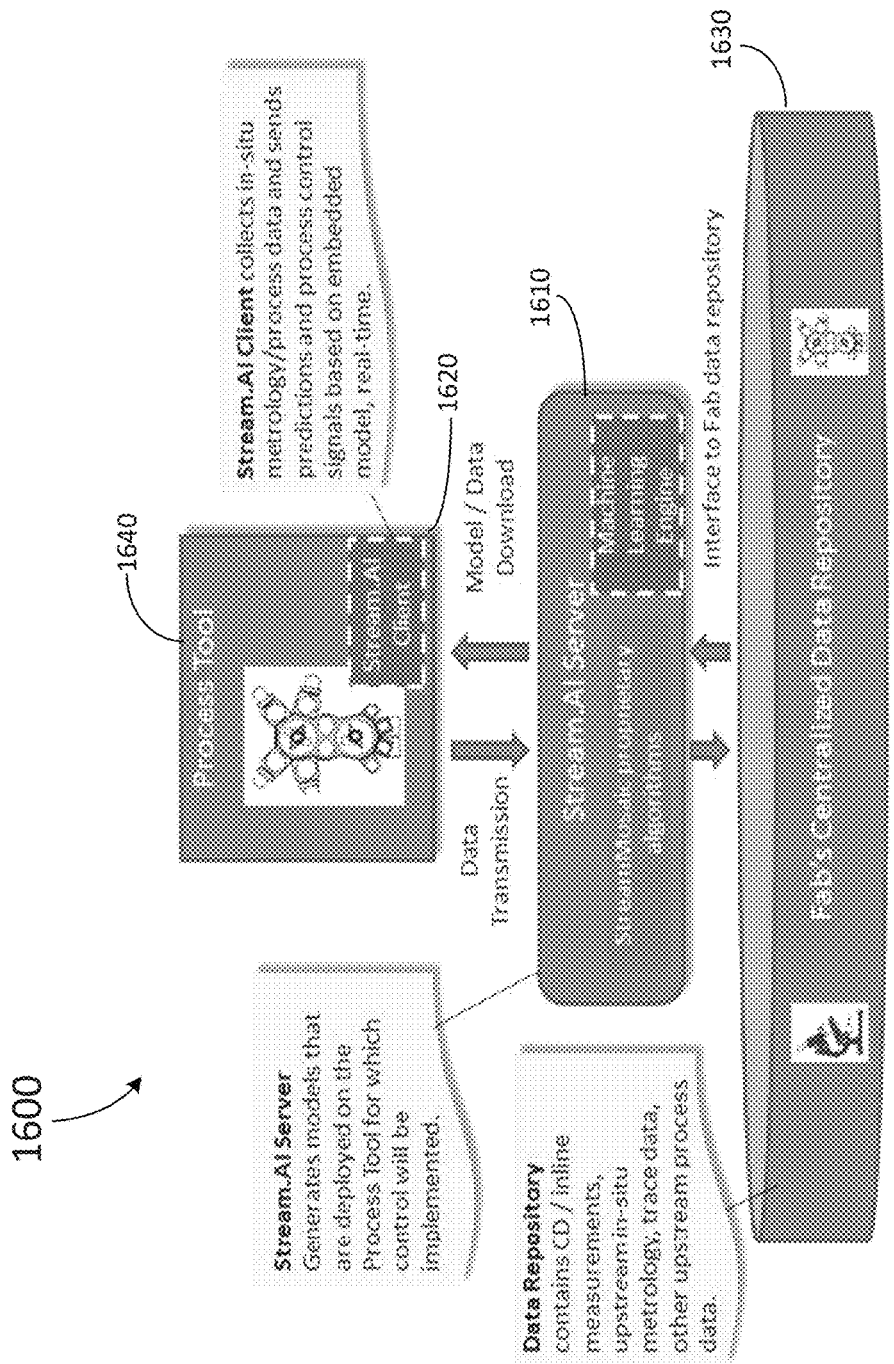
FIG. 16 is a block diagram illustrating a high level architecture for a model building system.

FIG. 16 illustrates an embodiment of a high level system architecture for creating and using models for improved semiconductor process control. At the highest level, the system consists of a model creation server (MCS) 1610 and one or more prediction clients (PCs) 1620 which can use models created by the MCS, and which interact with the fab's centralized data repository 1630. The MCS 1610 generates models that are deployed on the Process Tool 1640 for which control will be implemented. The PC 1620 collects in-situ metrology/process data and sends predictions and process control signals based on an embedded model, in real time. The data repository 1630 contains CD/inline measurements, upstream in-situ metrology, trace data, and other upstream process data.

At set time periods, the MCS can collect data about the manufacturing process from one or more sources. This data can typically be a collection of readings from sensors used in the manufacturing process. The collection can typically be all the relevant measurements made during the manufacturing of a set of earlier completed items. After collecting data, the MCS can enter a model building phase. During the model build phase, the MCS can build numerous machine learning models designed to make a prediction. From the generated models, one or more preferred models can be selected. Code for these models can be generated and compiled and sent to the PCs. The PCs can be software programs that periodically receive the data from prior steps in the manufacturing process for the current item. They then can use the generated model(s) to predict necessary information for the current manufacturing step on an item.

The MCS 1610 can periodically build new models for the PCs. The desired frequency of this period is provided by the user of this system. Further the user can be allowed to specify the length of time spent in creation of new models. At the end of this time period, the system can choose the best model(s) and send a program to the PCs that implements the model(s).

Prior to the model building phase, the MCS can collect the needed data. The sources of this data can be set by the user of this system. The data sources can be, but are not limited to, databases of collected information, local or remote files containing the desired data, or through network connections that feed the data to the MCS.

Collected fields data can be labelled according to its importance. This labelling of data fields may be done as a configuration step, by a user of the system, or by the system itself from information it learned in analyzing the prior data. The labels can be used to help the system understand the role a given data field plays in the prediction making process. Examples of potential labels are:

Critical: a new model or prediction will not be made without this data

Non-critical-replaceable: a new model or prediction can be made with older copies of the data field or imputed values for the field Non-critical-irreplaceable: a new model or prediction will be made with reduced accuracy.

New data can be checked for correctness. The system can check for correct column/field counts, correct header names, value types, reasonable values, missing values, null values, or unexpected whitespace. These checks can be set by the user, or system configuration, or suggested by the system based on prior values seen. Further, new data can be checked by use of a checksum or similar device to ensure that the new data is not an unintended repeat of earlier data. Deviance from the expected values can generate a warning if non-critical, or an error if critical data is not available.

If the MCS is configured to rely on several data sources to build a model and one or more of those data sources cannot provide the expected data, and that data has been labelled as Non-critical, then the model building can proceed after repeated attempts to collect the data. Model building will proceed using the most appropriate choice: use prior data in place of the missing data, impute missing data values, or build models without it. The most appropriate choice may be set by either the user, system configuration, or the system itself.

In some cases it can be necessary for the user to specify a subset of the historical data that should be ignored or weighted differently during the training of a model. An example that would require this is when models are built relying on an upstream data source and the performance of that source is changed radically (e.g. repairs, or given new settings). In such cases a user would know explicitly about the change, and could adjust how or if that historical data should be used.

This system provides the means for a user to specify what data should be treated differently and how in future training. Further when the system detects large changes in a data source, it can send an alert to the user to consider whether such changes should be considered.

This historical data may be stored in a local database that the system uses in the cases where the data sources do not store enough historical data.

Once the data is collected, it may then need to be transformed into a more appropriate format for model building. Some transformations will be operations typical to standard database operations. For example: inner-join, outer-join, partial joins, group-by, columnar or row wise appending of two datasets. Other transformations may involve value imputation. If value imputation is needed, several methods may be used. Examples are: expected means, imputation through Generalized Low Rank Models. Beyond this, a wide variety of domain transformations will be used to convert data fields into new fields that are better suited to constructive machine learning models. These transformations can have a wide range of possibilities. For example, in the manufacturing of semiconductors, transformations of spectra may involve low pass filters, Fourier transforms, binning values and tracking peaks, among other things. In wafer processing an example would be the transformation of coordinate systems. Some examples of other common transformations are:

Normalization: the generation of z-scores from an existing field, or offset by mean divided by the standard deviation.

Aggregation: aggregate the mean failures for an individual LotID/WaferID, aggregate the mean of an input value for a given radial band on the wafer.

Binning: decile binning.

Modelling: using the output of one model as input to another, common examples are PCA, GLRM, clustering, regressions, or classifications to create new data features.

Weight generation: the generation of weights to aid machine learning algorithms to give greater value to specific data input.

Rebalancing: countering imbalanced datasets with over or under sampling as needed.

Filtering: identification and possible removal or weighting of outliers.

The model building phase can be triggered by either manually by a user or through user settings. These settings may be a user defined schedule. This schedule may include a frequency that is a function of the amount of available data. As an example, a user may want frequent retraining until the historic data reaches a set size or the models reach a chosen metric to indicate stability. Other triggers for training can include rules within the system. An example could be PCs seeing data values occurring beyond a preset expected range. Such an event could be set as a rule for the PCs to contact the MCS and trigger a new model building phase.

During the model building phase, the MCS can build one model or an array of machine learning models. A limit to the training time to find the best model may be set by the user. The system can return the "best" model(s) found within that time.

Models training may begin from scratch, with check-pointed models or may be seeded with the results of simulated data from physics based models. The system will decide the most appropriate starting point.

The exploration of different models can be done as a hyperparameter search that explores the parameter space for each kind of machine learning model available to the system. The starting bounds for these hyperparameter searches may come from either configuration settings of the system, or from bounds created by the system from examining the results of previous model building phases. Randomly selected bounds may also be included to allow for the exploration of new model training parameter spaces.

Further model training may also include creating models that only rely on subsets of the available data fields. This modelling can be done to create alternate models that can be used in the cases where a client with realtime needs does not receive all expected data in time and needs to make a prediction with only partial data.

Selecting the "best" models can be based on metrics set by the user and or system configuration. In addition to standard machine learning metrics, other metrics include, but are not limited to, factors such as expected runtime costs (e.g. execution time, memory footprint) or known benefits of a particular model type. Another metric that may be included is checks for models that seem to predict too well. "Too good to be true" models are typically a sign of model overfitting and models with these characteristics can be rejected in favor of a model expected to generalize better.

New models may be compared against pre-existing models (i.e. models from a previous model training phase). It may be that previous models are chosen as the most desirable.

For data sets that warrant it, the performance of a model may be judged by cross-validation or against hold-out validation sets as the system deems appropriate.

An example of one factor that may drive many of the hyperparameter and evaluation choices is available data size. Specific model types or parameters settings may be known to generalize better or train more accurately for given dataset sizes. The system will apply this knowledge in its selection of training parameters and choosing the "best" model(s).

After the desired models are selected, these models are backed up and stored to either disk or a database.

In one embodiment, once the "best" model(s) are chosen, the MCS and PCs can begin the process of transferring the models to the clients. This process includes a communications handshake between the server and client that may include authentication. The models being sent may take one of many forms. The model can be expressed as either source code, compiled binary code, or a parameter list to allow the model to be recreated on the client side. The sending of the model may include encryption of the model being sent.

Once models are received by the PCs, the model can be checked for accuracy. The first check can be through a checksum to ensure that the model was transported as expected. A second check that may be conducted is against data values that are selected to give a set answer. The model can be fed these values and the answer checked for validity.

If a PC does not receive a correct model, the desired failover can be pre-set by the user. This failover can include a set number of retries, falling back to using previous models, or falling back to a "safe mode" whose operation is defined by the user.

The prediction client (PC) is a system that collects data from the prior manufacturing steps and using model(s) provided by the MCS to make a prediction. This prediction is published to a file, a database, a network connection, an API call or other electronic mechanism.

The client can attempt to acquire the expected data. The sources of this data are set by the user of this system. The data sources can be, but are not limited to, databases of collected information, local or remote files containing the desired data, API calls to software or through network connections that feed the data to the PC. If any data source is not available, the system can see if a user set time limit has been set to deliver a prediction. If enough time is expected to remain, it will repeat its attempts to acquire the needed data. If insufficient time remains, the system can see if partial data models exist for the available data. In the case that they do, the system can use the appropriate partial data model. In the case that time has elapsed, and no partial data models exist for the available data, the client can execute its "safe mode" action as well as send an alert to the MCS. The "safe mode" action is set by the user.

Further, if the values of the acquired data are not of the expected type or within expected value ranges (as set by the user or through system detection), the "safe mode" action will be executed.

In the case where a prediction can be made, that prediction may then be checked to ensure that the prediction is within acceptable bounds set by the user or the system. In the case that the prediction is beyond these bounds, the client will execute its "safe mode" action. In the case that the prediction is within the expected ranges, the prediction is delivered in accordance to the user specified manner. A log of the data, model used, and the prediction may be kept.

The system can have a defined path of acceptable behaviors. All activities outside of this path can generate alerts or warnings to be consumed by the users of the system.

Some mention of Safe Mode has been given above. Safe Mode can allow a contingency plan in the event, for example, if the data needed to make a prediction by the model(s) is not available, if anomalies are detected in the data or the input data is corrupt, or if a prediction falls outside of a user-defined range. Some examples of Safe Mode are given in FIG. 17 and FIG. 18.

Figure 17:
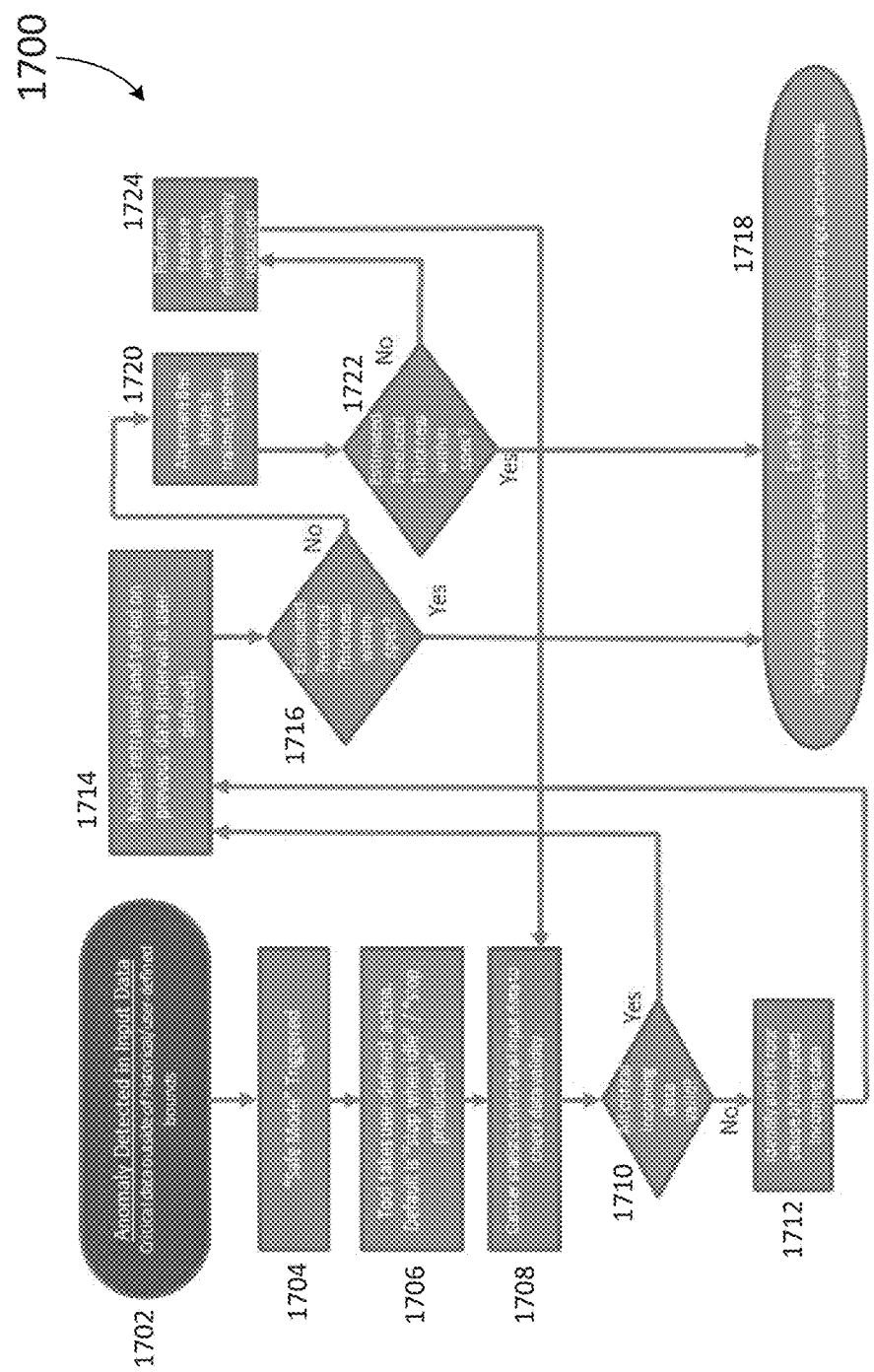
FIG. 17 is a flow chart illustrating action steps taken when an anomaly is detected in the input data.

FIG. 17 illustrates one embodiment of a Safe Mode 1700 that is initiated in step 1702 when there is an anomaly detected in the input data, i.e., critical data is outside of historical and/or user defined bounds. This data anomaly triggers the Safe Mode in step 1704. In step 1706, the process tool takes a user-defined action. An example default setting is "stop when idle" or "stop production."

In step 1708, statistics are gathered on critical input data to check if the data is valid. If critical incoming data is valid in step 1710, then the model is retrained and tested on previous data, and the interval is user-defined. If critical incoming data is not valid in step 1710, then the root cause of corrupted incoming data is fixed in step 1712 before continuing to step 1714.

If, after the model is retrained in step 1714, the predicted thickness is within specification in step 1716, the Safe Mode is exited in step 1718 and active process control is reinstated.

If the predicted thickness is not within specification in step 1716, then alternate best models are trained and tested in step 1720. If the predicted thickness is now within specification in step 1722, the Safe Mode is exited in step 1718. If the predicted thickness is still not within specification in step 1722, then feature selection and dimensionality reduction is performed in step 1724, and the process returns to step 1708.

Figure 18:
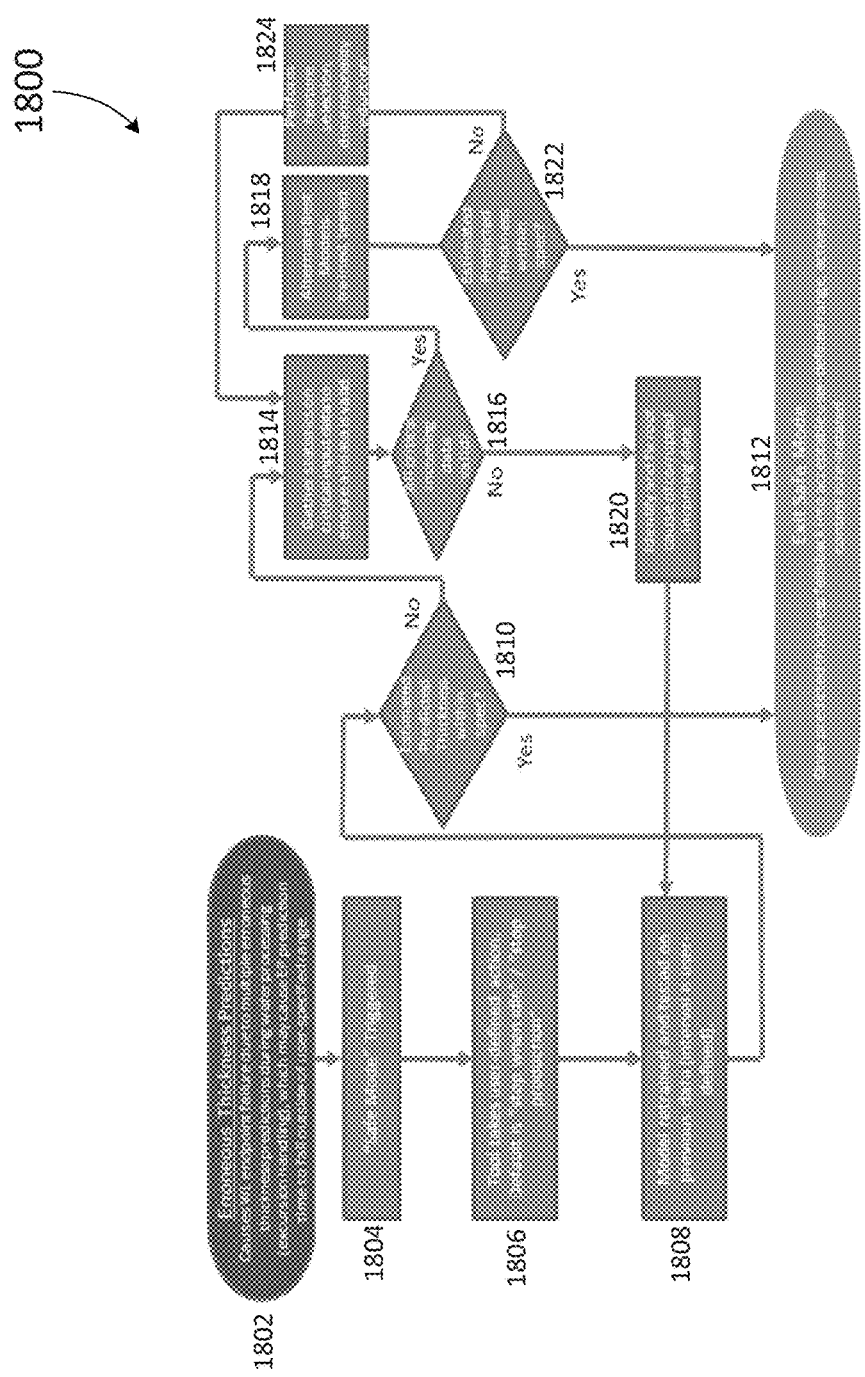
FIG. 18 is a flow chart illustrating action steps taken when erroneous thickness predictions are made in a virtual metrology system.

FIG. 18 illustrates another embodiment of a Safe Mode 1800 that is initiated in step 1802 when there are erroneous thickness predictions in a virtual metrology system. This causes WL endpoint failure due to multiple erroneous thickness predictions during wafer processing (excursion handling), which may cause EP prediction time to fall outside of a user-specified range. These erroneous thickness predictions trigger the Safe Mode in step 1804. In step 1806, the process tool takes a user-defined action. An example default setting is "stop when idle" or "stop production."

In step 1808, the model is retrained and tested on previous data, and the interval is user-defined. If the predicted thickness is within specification in step 1810, the Safe Mode is exited in step 1812 and active process control is reinstated.

If the predicted thickness is not within specification in step 1810, then statistics are gathered on critical input data in step 1814 to ensure the data is valid. If critical incoming data is valid in step 1816, then alternate best models are trained and tested in step 1818. If the predicted thickness is now within specification in step 1822, the Safe Mode is exited in step 1812. If the predicted thickness is still not within specification in step 1822, then feature selection and dimensionality reduction is performed in step 1824, and the process returns to step 1814.

If critical incoming data is not valid in step 1816, then the root cause of corrupted incoming data is identified and fixed in step 1820 and the process returns to step 1808 to again retrain and test the model.

10. Conclusion

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiments, methods, and examples.

The invention claimed is:

1. A method for predicting whether a semiconductor product will pass or fail a multi-step semiconductor process, comprising:
    receiving input data from a first plurality of metrology measurements for a current process step and from a second plurality of metrology measurements for at least one upstream process step;
    analyzing the input data to determine that a first set of the input data has a multi-variate relationship to at least one targeted process parameter for the current process step;
    evaluating the multi-variate relationship of the first set of the input data to form an initial prediction as to whether the current process step will cause a final semiconductor product formed by the semiconductor process to pass or fail;
    determining a confidence metric corresponding to the initial prediction; and
    generating a final prediction that the final semiconductor product will fail when the initial prediction is that the final semiconductor product will fail, or generating the final prediction that the final semiconductor product will fail when the initial prediction is that the final semiconductor product pass and the confidence metric is less than a threshold value.

2. The method of claim 1, further comprising:
creating a model for analyzing the input data, evaluating the multi-variate relationship of the input data for the targeted process parameter of the individual process step, and determining the confidence metric;
training the model using the input data; and
deploying the model for subsequent production runs of the semiconductor process.

3. The method of claim 2, further comprising:
receiving new input data from the subsequent production runs; and
retraining the model using the new input data.

4. The method of claim 2, wherein the model utilizes machine learning, predictive analytics and data mining techniques to analyze the input data, evaluate the multi-variate relationship of the input data, and determine the confidence metric.

5. The method of claim 2, further comprising:
identifying the input data that are relevant to the targeted process parameter;
collecting the identified input data;
cleansing the identified input data;
transforming the identified input data; and
training the model using the cleansed and transformed input data.

6. The method of claim 1, wherein the individual process steps of the semiconductor process include wafer fabrication, wafer test and sort, chip assembly and packaging, chip final testing, system level testing, and chip burn-in.

7. The method of claim 1, wherein the input data includes key performance indicators, parametric measurements, and product performance measurements.

8. The method of claim 1, wherein the metrology measurements include optical and non-optical measurements of the wafer fabrication process step.

9. The method of claim 7, wherein the input data includes data from final wafer electrical testing, wafer sort tests, and wafer acceptance tests.

10. The method of claim 1, wherein the final prediction is a weighted function that includes results of chip final testing, the confidence metric, and a yield classification.

11. The method of claim 2, further comprising:
creating a virtual metrology model based on data received from the at least one upstream process step; and
providing an output of the virtual metrology model as input data to the model.

12. The method of claim 1, further comprising utilizing the final prediction to determine next steps in the semiconductor process.

13. A method useful in a multi-step semiconductor process, comprising:
receiving sensor data from a plurality of pieces of production equipment during prior production runs of the semiconductor process;
receiving metrology measurements from a plurality of sampled wafers of the prior production runs;
determining a multi-variate relationship between the sensor data, the metrology measurements, and a targeted process parameter for one step of the multi-step semiconductor process; and
predicting metrology measurements for subsequent production runs based on the multi-variate relationship.

14. The method of claim 13, further comprising:
creating a virtual metrology model for predicting metrology measurements;
training the virtual metrology model using the sensor data and metrology measurements from prior production runs; and
deploying the virtual metrology model for subsequent production runs of the semiconductor process.

* * * * *